United States Patent
Kim et al.

(10) Patent No.: US 11,664,083 B2
(45) Date of Patent: May 30, 2023

(54) MEMORY, MEMORY SYSTEM HAVING THE SAME AND OPERATING METHOD THEREOF

(71) Applicant: Samsung Electronics Co., Ltd., Suwon-si (KR)

(72) Inventors: Byoungsul Kim, Suwon-si (KR); Hokyong Lee, Yongin-si (KR); Dongjun Kim, Hwaseong-si (KR); Byungmin Choi, Suwon-si (KR); Kideok Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 16/855,373

(22) Filed: Apr. 22, 2020

(65) Prior Publication Data
US 2021/0104291 A1 Apr. 8, 2021

(30) Foreign Application Priority Data

Oct. 7, 2019 (KR) .................. 10-2019-0123681

(51) Int. Cl.
*G11C 29/14* (2006.01)
*G11C 29/42* (2006.01)
(Continued)

(52) U.S. Cl.
CPC .......... *G11C 29/42* (2013.01); *G11C 11/4082* (2013.01); *G11C 11/4085* (2013.01);
(Continued)

(58) Field of Classification Search
CPC .............. G11C 11/401; G11C 11/4082; G11C 11/4085; G11C 11/4087; G11C 11/4091; G11C 11/4094
See application file for complete search history.

(56) References Cited

U.S. PATENT DOCUMENTS 6,560,148 B2 5/2003 Takami et al.
7,818,531 B2 10/2010 Barrall
(Continued)

FOREIGN PATENT DOCUMENTS

KR 10-2005-0104106 A 11/2005
KR 10-2007-0074322 A 7/2007
(Continued)

OTHER PUBLICATIONS

DIMMs and The Intel Nehalem Memory Architecture Connection, Jul. 20, 2011, published in DeinosCloud by PiroNet (Year: 2011).*
(Continued)

*Primary Examiner* — Alfredo Bermudez Lozada
(74) *Attorney, Agent, or Firm* — Harness, Dickey & Pierce, P.L.C.

(57) ABSTRACT

A memory system including a first central processing unit, a first memory module connected to the first central processing unit by a first channel, a second memory module connected to the first central processing unit by a second channel, and a third memory module connected to the first central processing unit by a third channel may be provided. Each of the first memory module, the second memory module, and the third memory module may be configured to write the same data in a data area thereof and a mirroring data area thereof in response to an address in a mirroring mode.

19 Claims, 26 Drawing Sheets

(51) Int. Cl.
*G11C 29/44* (2006.01)
*G11C 29/00* (2006.01)
*G11C 11/4094* (2006.01)
*G11C 11/408* (2006.01)
*G11C 11/4091* (2006.01)

(52) U.S. Cl.
CPC ...... *G11C 11/4087* (2013.01); *G11C 11/4091* (2013.01); *G11C 11/4094* (2013.01); *G11C 29/14* (2013.01); *G11C 29/44* (2013.01); *G11C 29/78* (2013.01); *G11C 2029/4402* (2013.01)

(56) References Cited

U.S. PATENT DOCUMENTS

| | | | |
|---|---|---|---|
| 8,689,041 | B2 | 4/2014 | Lu |
| 9,136,021 | B2 | 9/2015 | Yang et al. |
| 9,996,411 | B1 | 6/2018 | Chinnakkonda Vidyapoornachary et al. |
| 2007/0058410 | A1 | 3/2007 | Rajan |
| 2013/0132779 | A1 | 5/2013 | Smith et al. |
| 2015/0309899 | A1* | 10/2015 | Woo .......... G06F 1/12 711/162 |
| 2016/0132408 | A1 | 5/2016 | Chinnakkonda Vidyapoornachary et al. |
| 2018/0095681 | A1* | 4/2018 | Swanson .......... G06F 3/0688 |
| 2018/0107591 | A1 | 4/2018 | Smith |
| 2019/0004909 | A1 | 1/2019 | Alameer et al. |
| 2019/0012232 | A1 | 1/2019 | Plants |

FOREIGN PATENT DOCUMENTS

| | | |
|---|---|---|
| KR | 10-2007-0087516 A | 8/2007 |
| KR | 10-2008-0039466 A | 5/2008 |

OTHER PUBLICATIONS

HP ProLiant DL360 Generation 7 QuickSpecs, Mar. 23, 2013 (Year: 2013).*

* cited by examiner

MSB

```
             CMOS Setup Utility

▶ Standard CMOS Features          | Load High Reliability Memory |
 ▶ Standard BIOS Features            Load Optimized Defaults
 ▶ Intergrated Peripherals           Set Supervisor Password
 ▶ Power Management Setup            Set User Password
 ▶ Pnp/PCI Configurations            Save & Exit Setup
 ▶ PC Helth Status                   Exit Without Saving
 ▶ MB Intelligent Tweaker(M.I.T.)

Esc : Quit           ↑↓→← : Select Item     F11 : Save CMOS to BIOS
 F8 : Q-Flash         F10 : Save & Exit Setup  F12 : Load CMOS from BIOS
```

FIG. 16

MEMORY, MEMORY SYSTEM HAVING THE SAME AND OPERATING METHOD THEREOF

CROSS-REFERENCE TO RELATED APPLICATION

This application claims priority under 35 U.S.C. § 119 to Korean Patent Application No. 10-2019-0123681 filed on Oct. 7, 2019 in the Korean Intellectual Property Office, the disclosure of which is incorporated herein by reference in its entirety.

BACKGROUND

The present inventive concepts relate to memories for improving reliability for data, memory systems having the same, and/or operating methods thereof.

As a Dynamic Random Access Memory (DRAM) process is miniaturized, cell characteristics may become deteriorated, and the likelihood of cell defects may increase. Memory failure may be an important issue in applications to data centers, autonomous vehicles, and the like. Therefore, in a case in which a single bit error or a multi-bit error occurs in a memory, a device for repairing such a failure is desired.

FIG. 1 is a diagram illustrating a normal operation of a general memory system. Referring to FIG. 1, a memory system may include 2-CPUs (Central Processing Unit) (CPU1 and CPU2), 3-Channel (CH1, CH2, and CH3) connected to CPU1 and 3-Channel (CH4, CH5, and CH6) connected to CPU2, and 3-DIMM (Dual In-line Memory Module). As illustrated in FIG. 1, the memory system may be composed of three DIMMs connected to each of six channels CH1 to CH6, and in a normal operation, the memory system may use a total of 18 DIMMs. For example, a memory system may employ channel mirroring operation to improve reliability.

FIG. 2 is a diagram illustrating a channel mirroring operation of a general memory system. Referring to FIG. 2, a channel mirroring operation has problems such as a decrease in performance and a decrease in memory capacity (½ of the normal operation of the total memory capacity, or worst case ⅓ thereof) according to a decrease in channel, or the like.

When the mirroring mode is not applied, as illustrated in FIG. 1, the memory system may fully operate the Channels and the DIMMs, and thus may have effects on the memory capacity and performance. When the mirroring mode is applied, as illustrated in FIG. 2, reliability may be improved according to a mirroring operation of CH1/CH2. Because CH1 is used for a mirroring mode operation, but CH2 is not used, the total capacity may decrease to ⅓. Further, because there is no channel operation, the overall performance may decrease.

Further, the channel mirroring operation requires an additional error correction code (ECC) configuration inside the memory module for bad reads. It may be difficult to apply to a memory system which does perform memory operation without using channels and does not have ECC configuration. For example, when a failure occurs during memory access operation in an autonomous vehicle, a mobile system, and a graphics system to which a session initiation protocol (SIP) is applied, a system halt or abnormal data processing may cause a critical issue.

SUMMARY

An aspect of the present inventive concepts is to provide memories for improving reliability for data, memory systems having the same, and/or operating methods thereof.

According to an aspect of the present inventive concepts, a memory system may include a first central processing unit, a first memory module connected to the first central processing unit by a first channel, a second memory module connected to the first central processing unit by a second channel, and a third memory module connected to the first central processing unit by a third channel Each of the first memory module, the second memory module, and the third memory module may be configured to write the same data in a data area thereof and a mirroring data area thereof in response to an address in a mirroring mode.

According to an aspect of the present inventive concepts, a memory system may include at least one memory, and a memory controller controlling the at least one memory. The at least one memory may include a first memory area configured to store writing data during a write operation in a mirroring mode, a second memory area configured to store the writing data during the write operation in the mirroring mode, and processing circuitry configured to generate a read failure signal when a read operation of the first memory area fails in the mirroring mode.

According to an aspect of the present inventive concepts, a memory system may include at least one memory configured to generate an error detection signal when an error is detected in data output from a memory cell array during a read operation, and write the same data to a first memory area of the at least one memory and a second memory area of the at least one memory during a write operation in a mirroring mode, and a memory controller is configured to control the at least one memory with the error detection signal. The memory controller may be configured to monitor the error detection signal to determine whether the mirroring mode of the at least one memory is activated.

According to an aspect of the present inventive concepts, an operating method of a memory may include setting a mirroring mode, writing the same data to a first memory area of the memory area and a second memory area of the memory corresponding to a single address during a write operation, detecting errors of data read from the first area during a read operation, changing a data output path of the read operation when a number of detected errors is equal to or greater than a reference value, and requesting a read-reclaim to a memory controller when the number of the detected errors is equal to or greater than the reference value.

According to an aspect of the present inventive concepts, a memory may include a memory cell array having a first memory area and a second memory area, the memory cell array having a plurality of memory cells connected to word lines and bit lines, a row decoder configured to select any one of the word lines in response to a row address, a sense amplifier circuit configured to sense data from memory cells connected to selected bit lines during a read operation, a column decoder configured to select the selected bit lines among the bit lines in response to a column address, an address buffer configured to store an address having the row address and the column address, and processing circuitry configured to correct an error of the sensed data, and generate a read failure signal when the error correction has failed, generate a mirroring mode activation signal corresponding to a mirroring mode, write the same writing data to the first memory area and the second memory area during a write operation in the mirroring mode, and change a data output path of the read operation from a first data output path of the first memory area to a second data output path of the second memory area in response to a read retry command in the mirroring mode.

BRIEF DESCRIPTION OF DRAWINGS

The above and other aspects, features, and advantages of the present inventive concepts will be more clearly understood from the following detailed description, taken in conjunction with the accompanying drawings, in which:

FIG. 16 is a diagram illustrating a Basic Input/Output System (BIOS) setup according to an example embodiment of the present inventive concepts.

DETAILED DESCRIPTION

Hereinafter, example embodiments of the present inventive concepts will be described with reference to the accompanying drawings.

A memory system according to an example embodiment of the present inventive concepts may operate by an on-die mirroring technique that enables reliability in a mirroring mode without causing the decrease in performance and capacity. In this case, the on-die mirroring technique may be a method of performing a mirroring operation by itself in the memory module.

Figure 1:
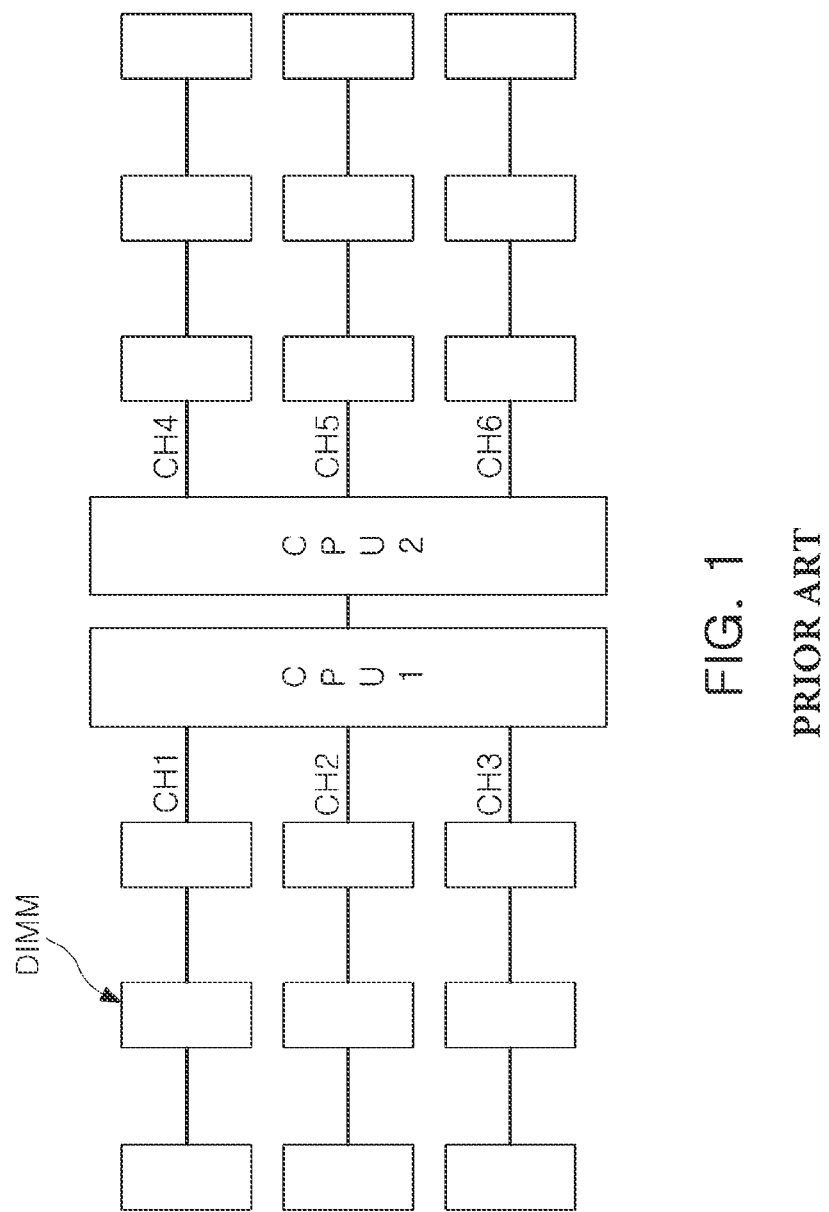
FIG. 1 is a diagram illustrating a normal operation of a general memory system.
Figure 2:
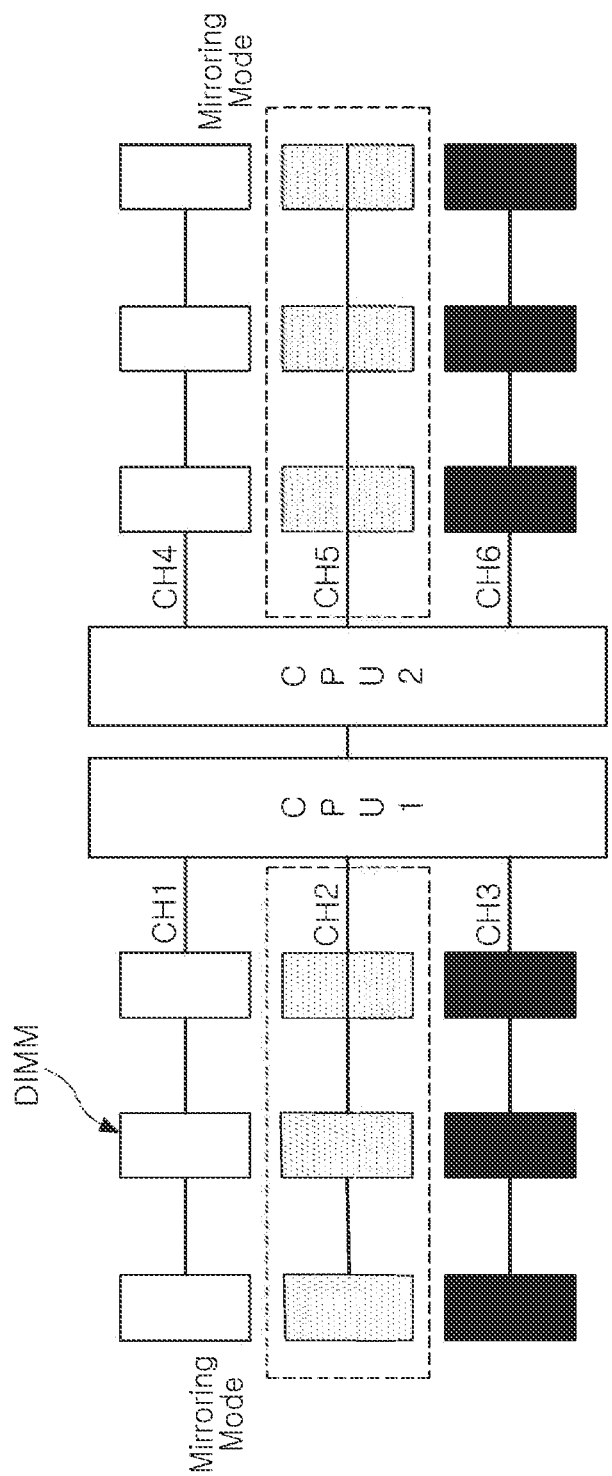
FIG. 2 is a diagram illustrating a channel mirroring operation of a general memory system.
Figure 3:
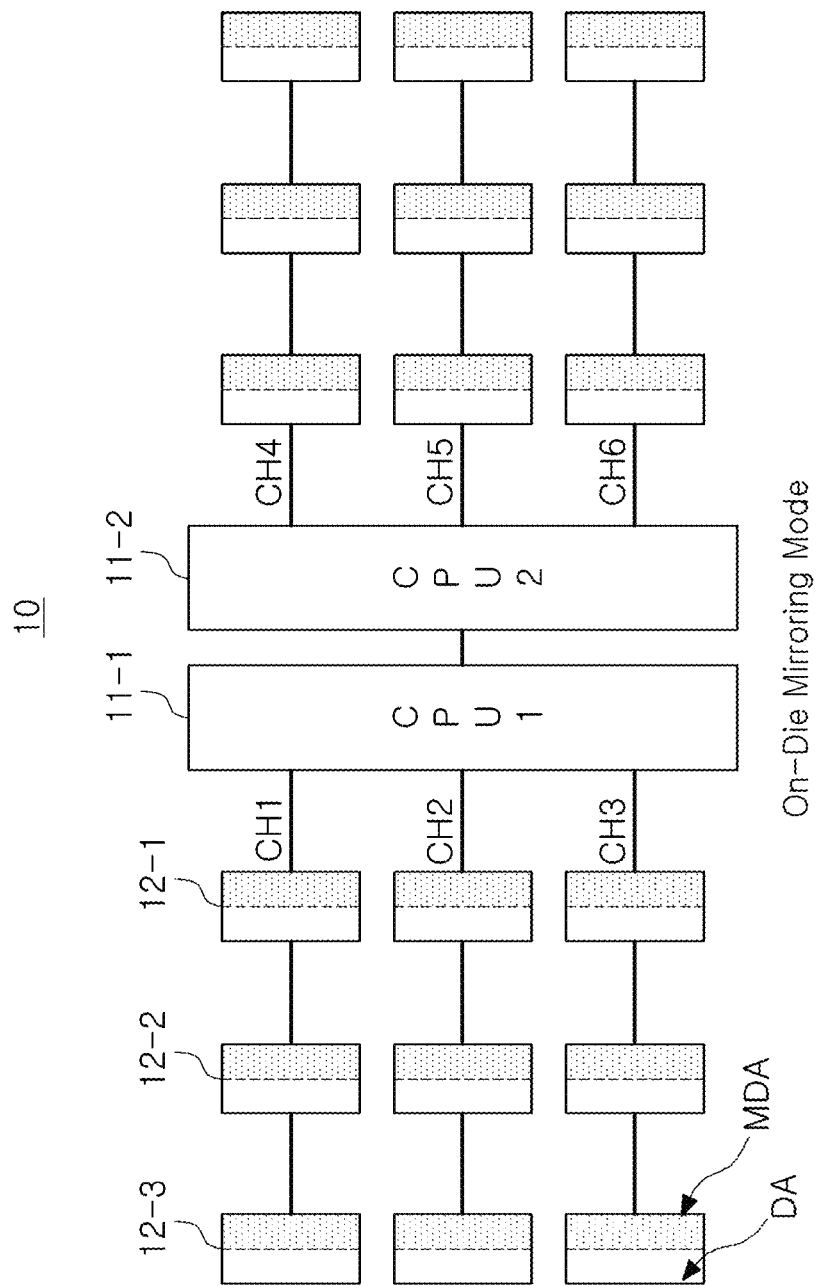
FIG. 3 is a diagram illustrating a memory system 10 according to an example embodiment of the present inventive concepts.

FIG. 3 is a diagram illustrating a memory system 10 according to an example embodiment of the present inventive concepts. Referring to FIG. 3, the memory system 10 may include a first CPU 11-1, a second CPU 11-2, three channels CH1 to CH3 and CH4 to CH6 connected to each of the first CPU 11-1 and the second CPU 11-2, and memory modules 12-1, 12-2, and 12-3 connected to each of the channels CH1 to CH3 and CH4 to CH6. It should be understood that the number of CPUs, the number of channels, and the number of memory modules are not limited thereto.

In some example embodiments, each of the memory modules 12-1, 12-2, and 12-3 may be implemented with a single in-line memory module (SIMM), a dual in-line memory module (DIMM), and a small-outline DIMM (SODIMM), an unbuffered DIMM (UDIMM), a fully-buffered DIMM (FBDIMM), a rank-buffered DIMM (RB-DIMM), a mini-DIMM, a micro-DIMM, a registered DIMM (RDIMM), or a load-reduced DIMM (RDIMM). In an example embodiment, each of the memory modules 12-1, 12-2, and 12-3 may include a volatile memory device or a nonvolatile memory device.

In an example embodiment, the memory system 10 may perform an on-die mirroring operation in each of the memory modules 12-1, 12-2, and 12-3 connected to the channels CH1, CH2, and CH3 in the on-die mirroring mode. In this case, the on-die mirroring operation may include a write operation of simultaneously writing the same data to a first area, (interchangeably referred to as data area (DA) of first memory area) and a second area (interchangeably referred to as mirrored data area (MDA) or second memory area) in response to a single address, and a read operation for outputting data read from any one of a first area DA and a second area MDA in response to any one address.

In an example embodiment, the memory system 10 may perform a read retry on each of the memory modules 12-1, 12-2, and 12-3 in the on-die mirroring mode. In this case, the read retry is to perform a read operation on the second area MDA when the read operation on the first area DA fails.

According to the example embodiment of the present inventive concepts, the memory system 10 may include the plurality of memory modules 12-1, 12-2, and 12-3 that perform the on-die mirroring operation, and thus data reliability may be secured while minimizing the decrease in performance and capacity even in the mirroring mode.

Figure 4:
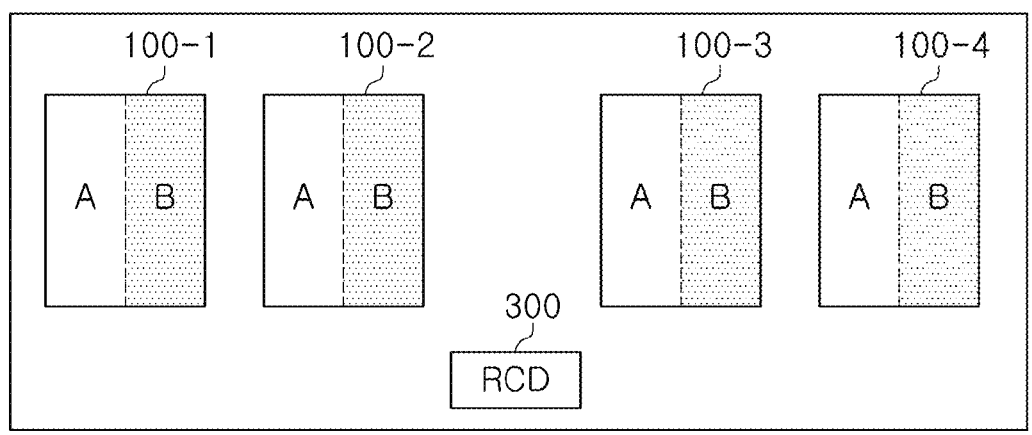
FIG. 4 is a diagram illustrating a memory module 12-1 according to an example embodiment of the present inventive concepts.

FIG. 4 is a diagram illustrating a memory module 12-1 according to an example embodiment of the present inventive concepts. Referring to FIG. 4, the memory module 12-1 may include a plurality of memories 100-1, 100-2, 100-3, and 100-4, and a registered clock driver circuit RSD 300.

Each of the memories 100-1 to 100-4 may include a volatile memory (e.g., a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a RAMBUS DRAM (RDRAM), or a static RAM (SRAM)), or a nonvolatile memory (e.g., a phase-change RAM (PRAM), a magneto-resistive RAM (MRAM), a resistive RAM (ReRAM), a ferro-electric RAM (FRAM), or a flash memory). In an example embodiment, each of the plurality of memories 100-1 to 100-4 may be implemented as a DRAM according to various standards (e.g., DDR, DDR2, DDR3, DDR4, or DDR5). Although the number of memories of the memory module illustrated in FIG. 4 is 4, it can be understood that the present inventive concepts are not limited thereto.

In an example embodiment, each of the plurality of memories 100-1 to 100-4 may be implemented to perform an on-die mirroring operation. As illustrated in FIG. 4, each of the memories 100-1 to 100-4 may include a first area A and a second area B that store the same data in response to a single address.

The registered clock driver circuit RCD 300 may be implemented to receive a command, an address, and a clock from the CPU 11-1. The registered clock driver circuit RCD 300 may transmit the received command, address, and clock to the memories 100-1 to 100-4.

Figure 5:
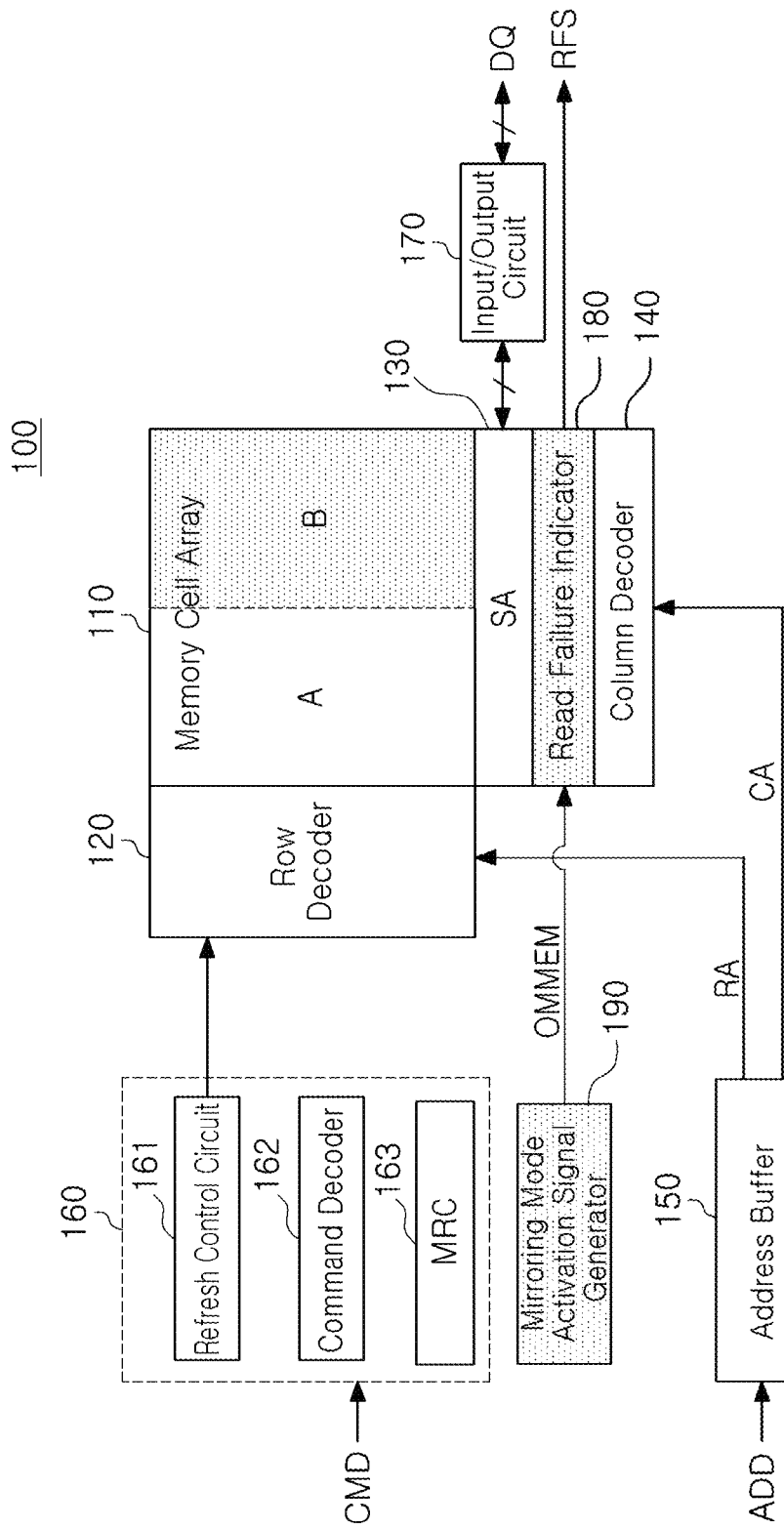
FIG. 5 is a diagram illustrating a memory 100 according to an example embodiment of the present inventive concepts.

FIG. 5 is a diagram illustrating a memory 100 according to an example embodiment of the present inventive concepts. Referring to FIG. 5, the memory 100 may include a memory cell array 110, a row decoder (or a row decoder circuit) 120, a sense amplifier circuit SA 130, a column decoder (or a column decoder circuit) 140, an address buffer 150, a control logic 160, an input/output circuit 170, a read failure indicator 180, and a mirroring mode activation signal generator 190. The control logic 160, the read failure indicator 180, and/or the mirroring mode activation signal generator controller 190 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 110 may include a plurality of banks having a plurality of memory cells arranged in a row direction and a column direction. In this case, the memory cells may be a volatile/nonvolatile memory cell, respectively. In an example embodiment, the memory cell array 110 may include a first area A (normal data area) and a second area B (mirrored data area).

The row decoder 120 may be implemented to select any one of the plurality of word lines in response to a row address RA. For example, the row decoder 120 may decode a row address RA output from the address buffer 150, and select a word line corresponding to the row address RA in a data writing/reading mode. In detail, the memory cells of a first area A and the memory cells of a second area B may be activated at the same time by selecting the word lines by the row decoder 120.

Further, the row decoder 120 may refresh a word line corresponding, based on the row address generated by a refresh control circuit 161.

The sense amplifier circuit 130 may be implemented to sense/amplify data of the selected memory cell. For example, the sense amplifier circuit 130 may sense data by sensing/amplifying a voltage of a bit line selected by the column decoder 140. When the memory bank includes a plurality of sub-arrays, the sense amplifier circuit 130 may include a plurality of sense amplifiers.

The column decoder 140 may be implemented to select a bit line connected to the memory cell in response to a column address CA. For example, the column decoder 140 may decode a column address CA output from the address buffer 150, and select a bit line corresponding to the column address CA in a data write/read mode. In more detail, the column decoder 140 may be connected to the memory cell array 110 through column select lines. The column decoder 140 may select column select lines based on a write/read command. When the column decoder 140 selects column select lines, bit lines BL may be selected.

The address buffer 150 may be implemented to receive an address ADD from an external device, for example, a memory controller. In this case, the address ADD may include a row address RA, a column address CA, a bank address, a bank group address, and the like.

The control logic 160 may be implemented to control the overall operation of the memory 100. The control logic 160 may include a refresh control circuit 161, a command decoder 162, and a mode register circuit (MRC) 163.

The refresh control circuit 161 may receive a decoded refresh signal from the command decoder 162, and may output an internal row address to the row decoder 120 to refresh one word line of the memory cell array 110.

The command decoder 162 receives a command CMD from an external device (a memory controller), and may internally generate command signals, for example, an activation signal, a reading signal, a writing signal, a refresh signal, and the like, provided by decoding the received command CMD.

The mode register circuit (MRC) 163 may set an internal mode register in response to a Mode Register Set (MRS)/Extended Mode Register Set (EMRS) command for designating an operating mode of the memory 100. The mode register circuit (MRC) 163 may output an activation signal to the input/output circuit 170 to control the operation of the input/output circuit 170 depending on the write operation/read operation. Further, the mode register circuit (MRC) 163 may include a register that sets a mirroring mode for performing an on-die mirroring operation. In FIG. 5, the on-die mirroring mode may be set by the mode register set (MRS), but it should be understood that the present inventive concepts may be not limited thereto.

The on-die mirroring mode of the present inventive concepts may be set by data received through at least one dedicated or predetermined pin. In an example embodiment, the on-die mirroring operation may be activated by setting a test mode register set (TMRS) through Basic Input/Output System (BIOS) settings in the system, may be activated by issuing a standardized mode register (MR) setting, or may be activated with a default mirroring operation by fusing.

The input/output circuit 170 may receive data from an external device through DQ pins during the write operation, and may transfer the received data to the sense amplifier circuit 130. Further, the input/output circuit 170 may receive data sensed by the sense amplifier circuit 130 from memory cells corresponding to the address ADD during a read operation, and may output the received data to an external device through the DQ pins.

Further, the input/output circuit 170 may be implemented to change the data output path according to a read retry command of an external device (memory controller). For example, the input/output circuit 170 may select a first read output path (normal data output path) to output data of the first area A in a normal read operation, and may select a second read output path (mirrored data output path) may be selected to output data of the second area B in a read operation according to a read retry command Although not illustrated, a switching circuit for selecting the first read output path and the second read output path may be provided.

The read failure indicator 180 may detect an error in detected data during a read operation, and may generate a read failure signal (RFS) corresponding to the detected error. For example, the read failure indicator 180 may generate a read failure signal (RFS) when the number of detected errors is equal to or greater than a reference value.

The mirroring mode activation signal generator 190 may generate an on-die mirroring mode activation signal OMMEN corresponding to the mirroring mode.

Although not illustrated in FIG. 5, the memory 100 may further include a clock circuit generating a clock signal, a power circuit generating or distributing an internal voltage by receiving a power supply voltage applied externally.

The memory 100 according to an example embodiment of the present inventive concepts may determine whether a read operation has failed, may transmit a read failure signal (RFS) corresponding to the result to an external device, and may output data of the mirrored area in response to a read retry command from the external device.

Figure 6:
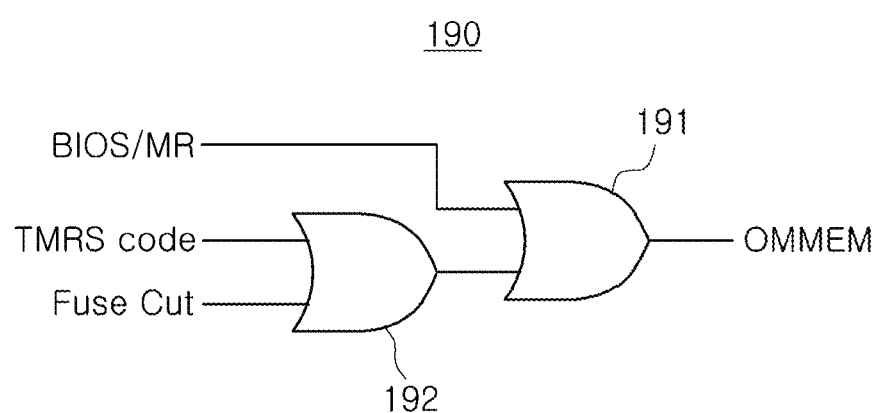
FIG. 6 is a diagram illustrating a write operation of a memory 100 in an on-die mirroring mode according to an example embodiment of the present inventive concepts.

FIG. 6 is a diagram illustrating the mirroring mode activation signal generator 190 according to an example embodiment. Referring to FIG. 6, the mirroring mode activation signal generator 190 may include a first logic circuit 191 and a second logic circuit 192.

The first logic circuit 191 may be implemented to OR operate a TMRS code value and fuse cut information. In this case, the fuse cut information may be generated through fuse cutting corresponding to the on-die mirroring mode in the test operation described with reference to FIGS. 3 and 4. Thus, the fuse cut information may be determined in the test operation.

The second logic circuit 192 may generate the mirroring mode activation signal OMMEN by performing an OR-operation on the BIOS/MR value and an output value of the first logic circuit 191.

Figure 7:
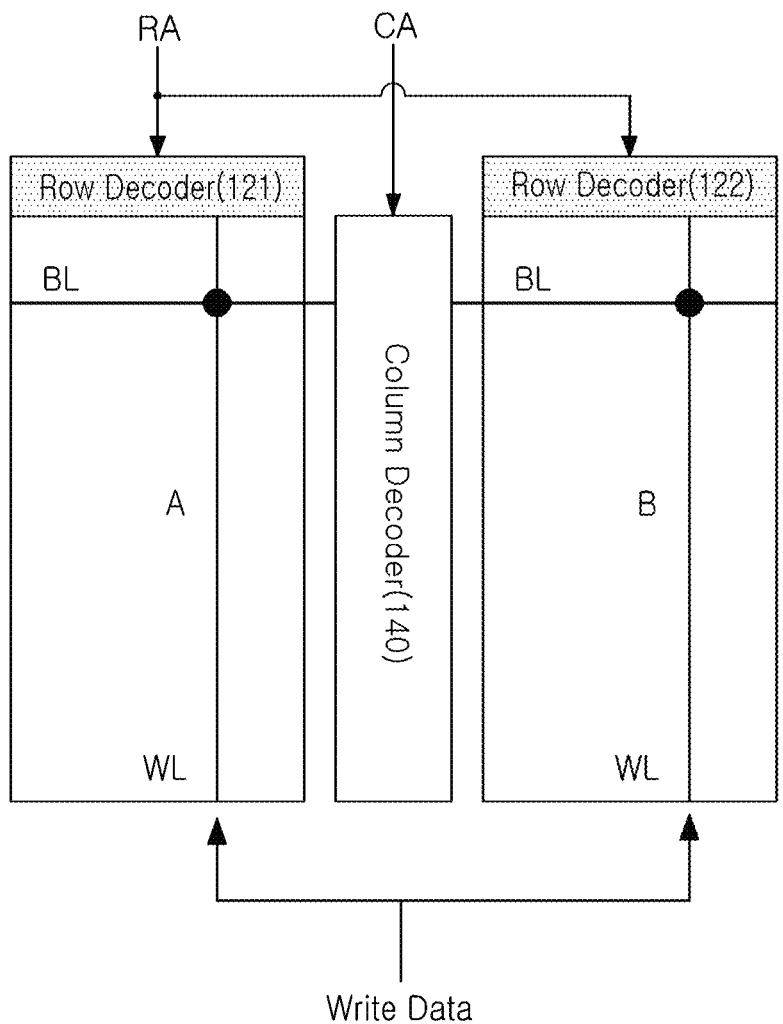
FIG. 7 is a diagram illustrating a mirroring mode activation signal generator 190 according to an example embodiment of the present inventive concepts.

FIG. 7 is a diagram illustrating a write operation of the memory 100 in the on-die mirroring mode according to an example embodiment. Referring to FIG. 7, the writing data may be written to a memory cell connected to a selected word line WL and a selected bit line BL in each of the first area A and the second area B, in response to a row address RA and a column address CA. The same data may be written to two memory cells corresponding to one row address RA.

The first area A and the second area B illustrated in FIG. 7 may be accessed through the column decoder 140 shared by corresponding row decoders 121 and 122, but the structure of the row decoder/column decoder is not limited thereto.

Figure 8A:
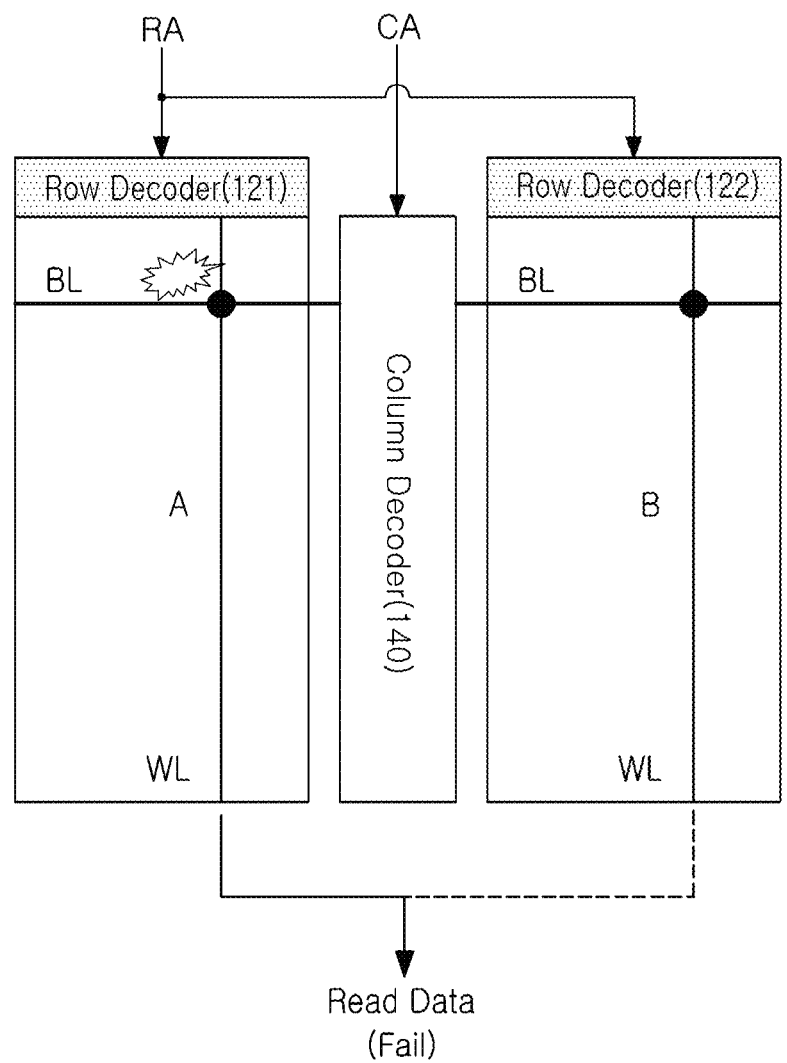
FIG. 8A is a diagram illustrating a read failure process in an on-die mirroring mode according to an example embodiment of the present inventive concepts.
Figure 8B:
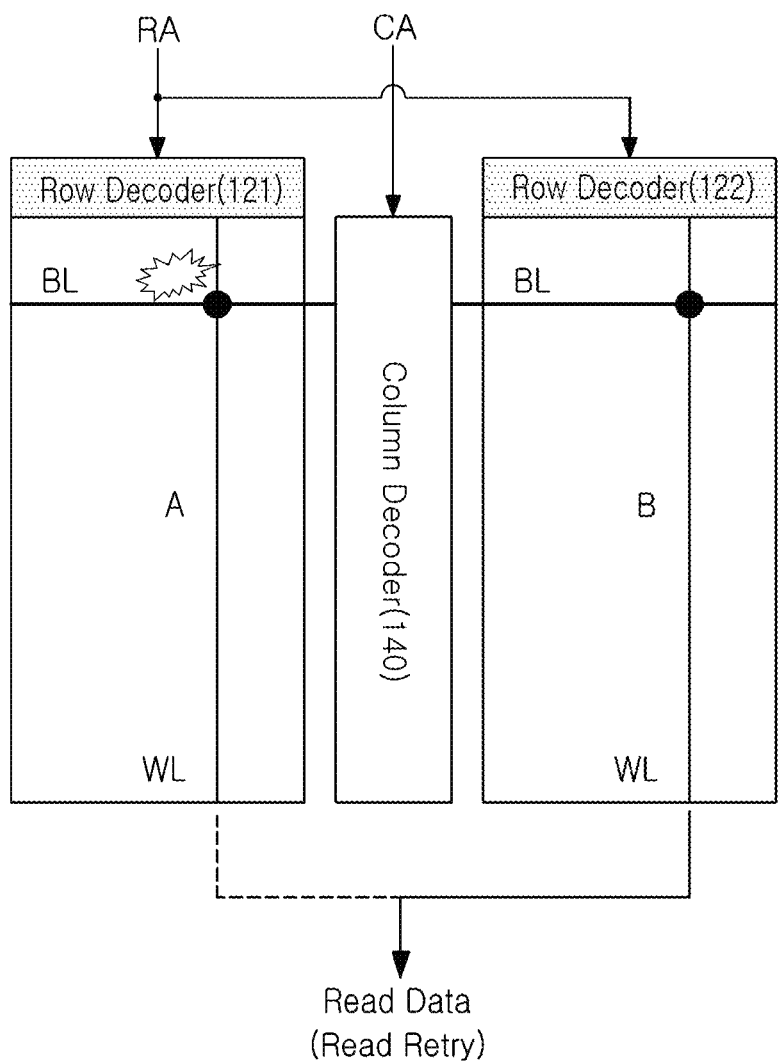
FIG. 8B is a diagram illustrating a read retry process in an on-die mirroring mode according to an example embodiment of the present inventive concepts.

FIG. 8A is a diagram illustrating a read failure process in an on-die mirroring mode according to an example embodiment, and FIG. 8B is a read retry process in the on-die mirroring mode according to an example embodiment.

Referring to FIG. 8A, for example, when a memory cell of the first area A is defective, there may be a failure to read the reading data. When reading fails, the memory 100 may transmit a read failure signal (RFS) to an external device (a memory controller).

Referring to FIG. 8B, when a read retry request is received from an external device, the memory 100 may output data reading from the memory cell of the second area B as reading data.

It should be note that example embodiments are not limited to the read retry. A memory according to an example embodiment may immediately output data of a memory cell of the second area B to an external device, without transmitting a read failure signal (RFS) for requesting a read retry to the external device, upon a read failure of the first area A.

Figure 9:
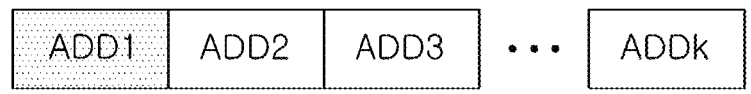
FIG. 9 is a diagram illustrating a configuration of a row address RA according to an example embodiment of the present inventive concepts.

FIG. 9 is a diagram illustrating a configuration of a row address RA according to an example embodiment. Referring to FIG. 9, the row address RA may include k row address bits ADD1, ADD2, ADD3, . . . , and ADDk. According to an example embodiment, a most significant bit (MSB) of the row address ADD, for example, a first address bit ADD1, may be ignored (Don't Care) by the row decoder 120 of the memory 100. For example, the memory 100 may access the first area A and the second area B by k−1 address bits.

In an example embodiment, a pin transmitting the most significant bit MSB (ADD1) of the row address RA in the memory 100 may be used as the pin transmitting a read failure signal (RFS). For example, a pin that transmits the most significant bit MSB of the row address RA when the memory cell is defective may output a high level signal to the memory controller.

To implement an on-die mirroring memory according to an example embodiment of the present inventive concepts, the most significant bit of a row address may be ignored. It should be understood that the present inventive concepts are not limited thereto. In some example embodiments, the on-die mirroring memory of the present inventive concepts may be implemented to ignore other bits except the most significant bit of the row address.

A row address may be used to implement an on-die mirroring memory according to an example embodiment of the present inventive concepts. It should be understood that the present inventive concepts are not limited thereto. Some example embodiments of The present inventive concepts may perform the on-die mirroring function using at least one of various types of addresses (e.g., column address, bank address, or bank group address) according to the design of the memory.

FIGS. 3 to 9 illustrate on-die mirroring schemes applied to the memory system 10 using the channel. An on-die mirroring scheme according to an example embodiment of the present inventive concepts may be applied to a memory system that does not require a channel in addition to the memory system 10 that uses a channel.

Figure 10:
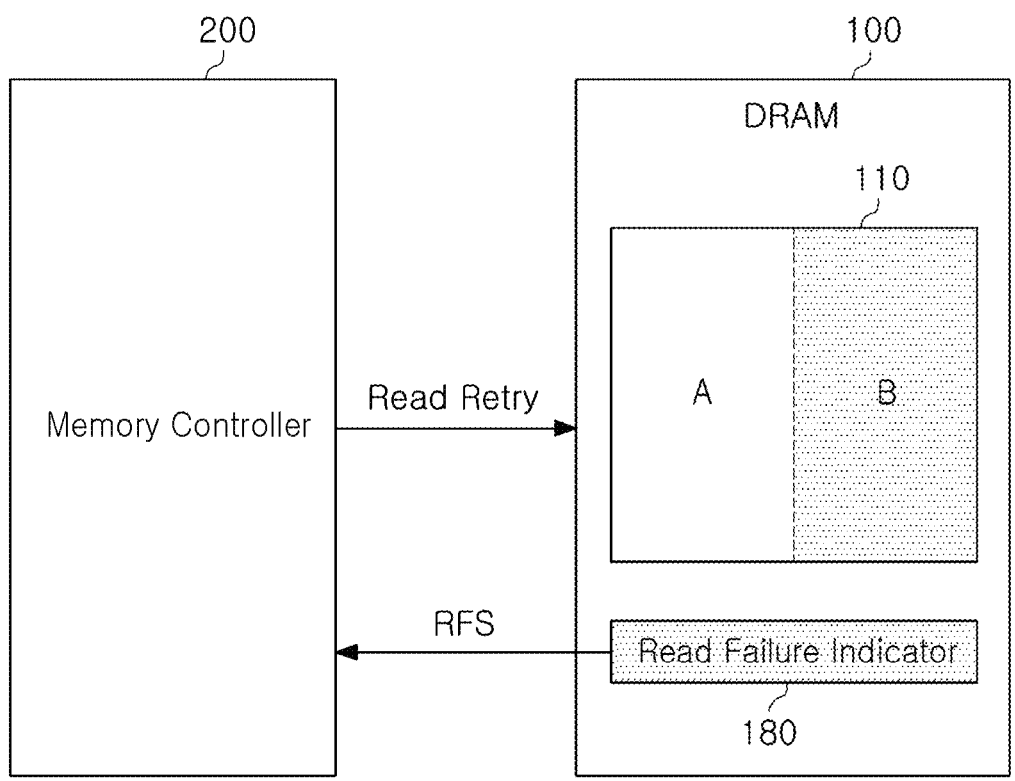
FIG. 10 is a diagram illustrating a memory system 20 according to an example embodiment of the present inventive concepts.

FIG. 10 is a diagram illustrating a memory system 20 according to an example embodiment of the present inventive concepts. Referring to FIG. 10, the memory system 20 may include a memory (DRAM) 100, and a memory controller 200 that controls the memory chip. The memory controller 200 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory 100 may include a memory cell array 110 having a first area A and a second area B that write the same data in response to a single address, and a read failure indicator 180 detecting a read failure in a read operation of the first area A/second area B.

In an example embodiment, the read failure indicator 180 may generate a read failure signal (RFS) during a read operation of any one of the first area (A) and the second area (B), and may transmit the read failure signal (RFS) to the memory controller 200.

The memory controller 200 may receive a read failure signal (RFS) from the memory 100, and request a read retry to the memory 100. The memory 100 may output data read from an area (e.g., the second area B), other than an area in which a read failed (for example, the first area A), in response to the read retry command, to the memory controller 200.

Figure 11A:
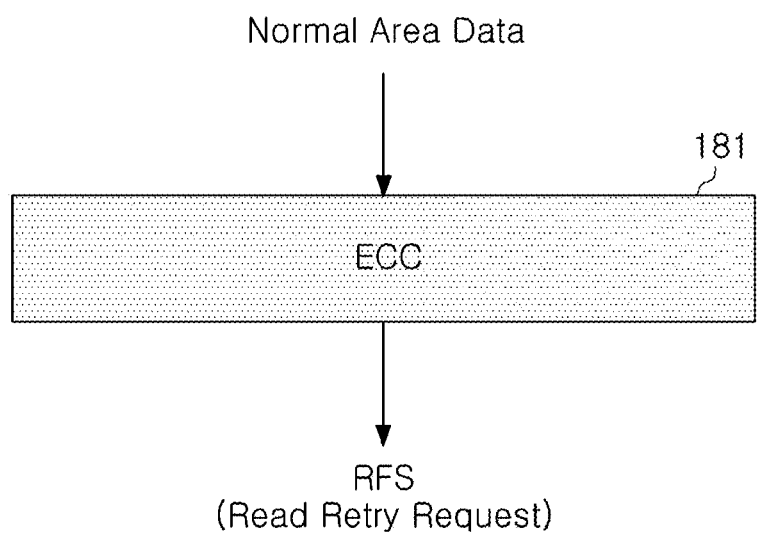
FIG. 11A is a diagram illustrating a read failure indicator 180 using an error correction circuit ECC.
Figure 11B:
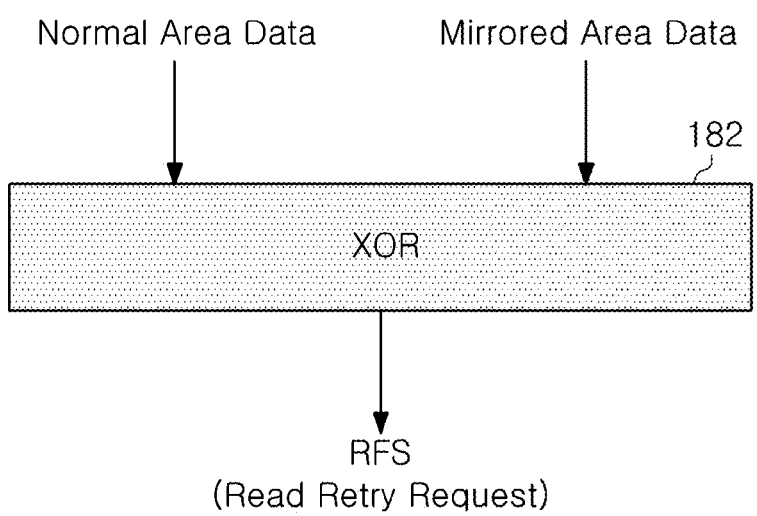
FIG. 11B is a diagram illustrating a read failure indicator 180 according to a data comparison method.

FIG. 11A is a diagram illustrating a read failure indicator 180 using an error correction circuit ECC, and FIG. 11B is a diagram illustrating a read failure indicator 180 according to a data comparison method.

Referring to FIG. 11A, the read failure indicator 180 may include an error correction circuit 181. The error correction circuit 181 may be implemented to correct an error of read data. At the same time, the error correction circuit 181 may generate a read failure signal (RFS) when error correction is not possible (e.g., when the error correction has failed). Referring to FIG. 11B, the read failure indicator 180 may include a logic circuit 182. Normal area data and mirrored area data may be output from a first area A and a second area B in response to the same address ADD. The logic circuit 182 may output the read failure signal (RFS) by performing an XOR operation on the normal area data and the mirrored area data. For example, when the normal area data and the mirrored area data are different from each other, the read failure signal (RFS) may be output. The read failure signal (RFS) may be used for a read retry request of a memory controller 200.

A memory 100 may generate a read retry request in response to the read failure signal (RFS), and may transmit the read retry request to the controller 200 in various ways. For example, the memory 100 may transmit a read retry request to the controller 200 by an additional pin, may transmit a read retry request to the controller 200 through a DQS dummy signal, or may transmit read retry information to the controller 200 by using a mode register (MR) read operation of the controller 200.

Further, the memory 100 may directly transmit a read failure signal (RFS) to the memory controller 200 in various ways without generating a read retry request in response to the read failure signal (RFS). For example, the read failure signal (RFS) may be transmitted to the memory controller 200 through a separate error indication signal (EIS) pin, or may be transmitted to the memory controller 200 by loading additional bits in DQS lines. In some example embodiments, the memory controller 200 may check a state of the memory 100 through a mode register MR.

Figure 12A:
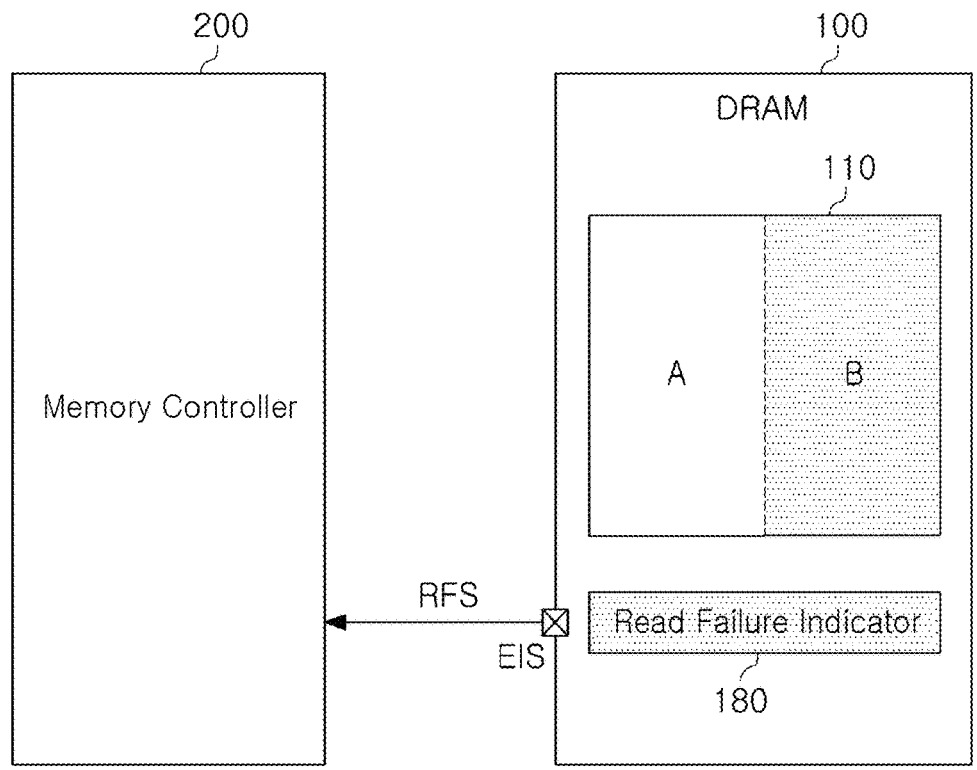
FIG. 12A is a diagram illustrating transmitting a read failure signal (RFS) to a memory controller 200 through an EIS pin of a memory 100.
Figure 12B:
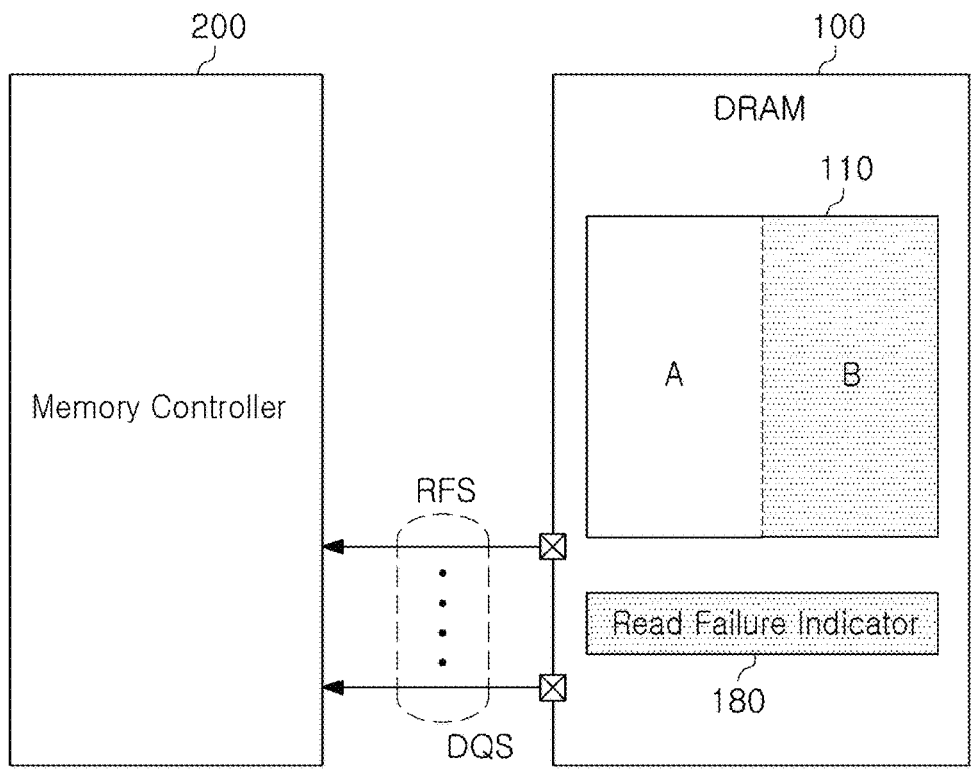
FIG. 12B is a diagram illustrating transmitting an RFS to a memory controller 200 through DQS pins of a memory 100.
Figure 12C:
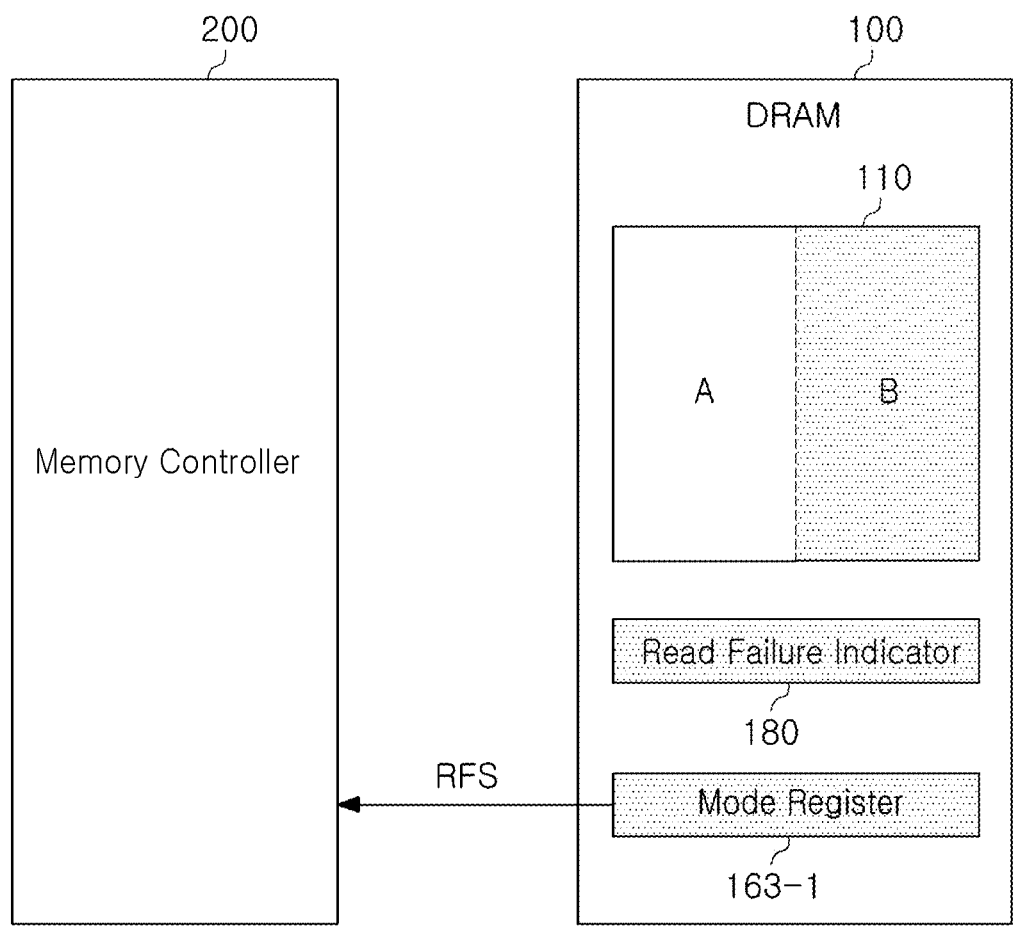
FIG. 12C is a diagram illustrating an RFS to a memory controller 200 through a mode register.

FIG. 12A is a diagram illustrating transmitting a read failure signal (RFS) to a memory controller 200 through an EIS pin of a memory 100, FIG. 12B is a diagram illustrating transmitting an RFS to a memory controller 200 through DQS pins of a memory 100, and FIG. 12C is a diagram illustrating transmitting an RFS to a memory controller 200 through a mode register.

Referring to FIG. 12A, the read failure signal (RFS) generated from the read failure indicator 180 may be transmitted to the memory controller 200 through a separate EIS pin of the memory 100.

Referring to FIG. 12B, the read failure signal (RFS) generated from the read failure indicator 180 may be transmitted to the memory controller 200 through the DQS pins.

Referring to FIG. 12C, the read failure signal (RFS) generated from the read failure indicator 180 may be stored in the mode register 163-1, and the memory controller 200 may receive the read failure signal (RFS) by reading periodically or non-periodically the mode register 163-1. In an example embodiment, the memory controller 200 may read the mode register 163-1 of the memory 100 according to an internal policy.

The memory system 20 described with reference to FIGS. 10, 11, 12A, 12B, and 12C has described the read retry operation in the on-die mirroring mode. In some example embodiments, the memory system of the present inventive concepts may set the on-die mirroring mode during a system operation.

Figure 13:
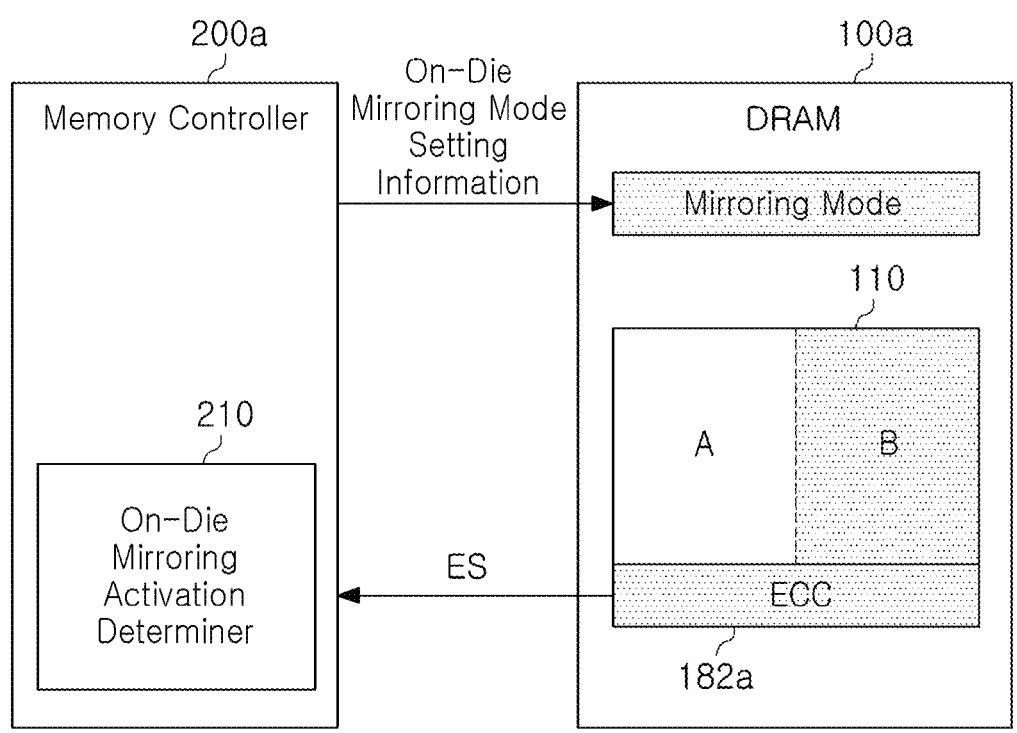
FIG. 13 is a diagram illustrating a memory system 30 according to another example embodiment of the present inventive concepts.

FIG. 13 is a diagram illustrating a memory system 30 according to another example embodiment of the present inventive concepts. Referring to FIG. 13, the memory system 30 may include a memory 100a and a memory controller 200a.

The memory 100a may include an error correction circuit ECC 182a that detects an error of read data and generates an error signal (ES). The error signal (ES) may be transmitted to the memory controller 200a.

The memory controller 200a may include an on-die mirroring activation determiner (or an on-die mirroring activation determination circuit) 210 that receives the error signal (ES) from the memory 100a and determines whether an on-die mirroring operation is active. The memory controller 200a may monitor the error correction operation of the memory 100a, to check a deterioration state of the memory cell and quantify possibility of occurring failure. When the possibility of a failure occurring exceeds a certain threshold, the memory controller 200a may activate the on-die mirroring mode of the memory 100a in an on-the-fly manner using BIOS/MR/TRMS, or the like.

Figure 14:
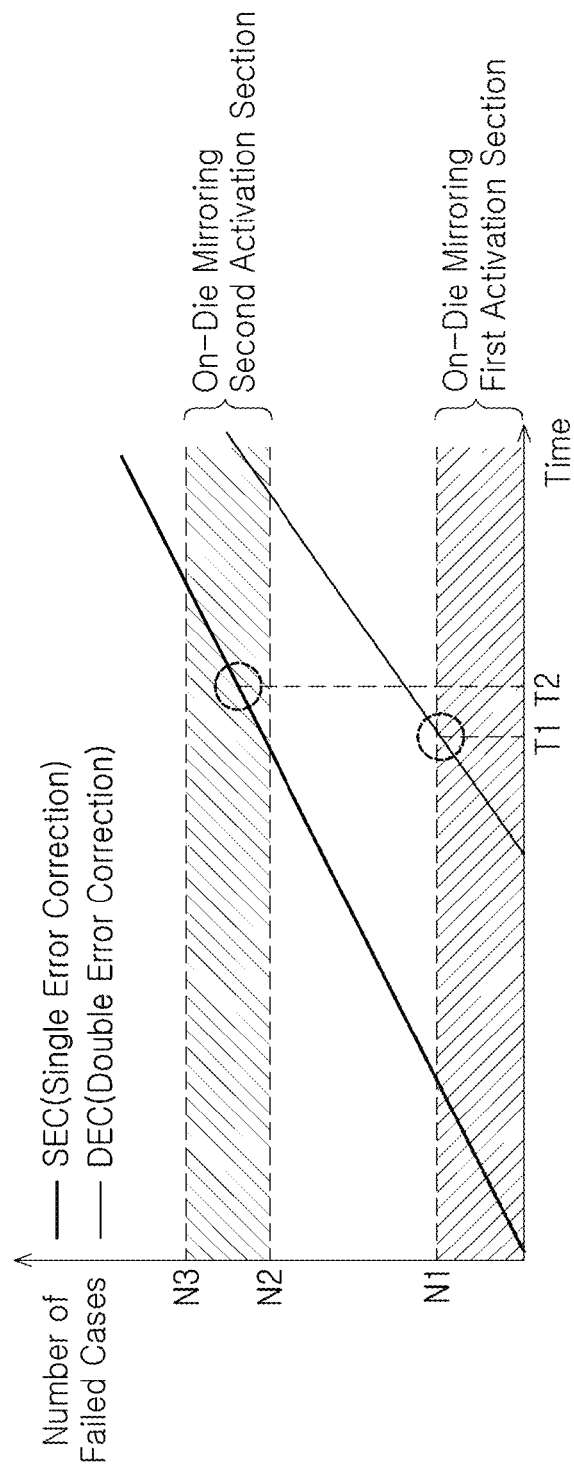
FIG. 14 is a diagram illustrating a result of monitoring an error correction operation and an on-die mirroring activation section according to an example embodiment of the present inventive concepts.

FIG. 14 is a diagram illustrating a result of monitoring an error correction operation and an on-die mirroring activation section according to an example embodiment of the present inventive concepts. Referring to FIG. 14, it can be seen that the number of failed cases gradually increases over time.

As illustrated in FIG. 14, the on-die mirroring activation section may include a first activation section 0~N1 and a second activation section N2~N3.

The first activation section 0~N1 may be a section having a high probability of occurring double error correction (DEC). The second activation section N2~N3 may be a section capable of being cell rescued, but activating an on-die mirroring operation in consideration of degradation time. For example, when first time T1 has passed and the number of failed cases in the DEC exceeds N1, the on-die mirroring mode may be entered. When second time T2 has passed and the number of failed cases in single error correction (SEC) is between N2 and N3, the on-die mirroring mode may be entered.

It should be understood that the on-die mirroring activation section of the present inventive concepts are not limited thereto. On-die mirror activation may be preemptively considered or initially set in consideration of various environmental information.

Figure 15:
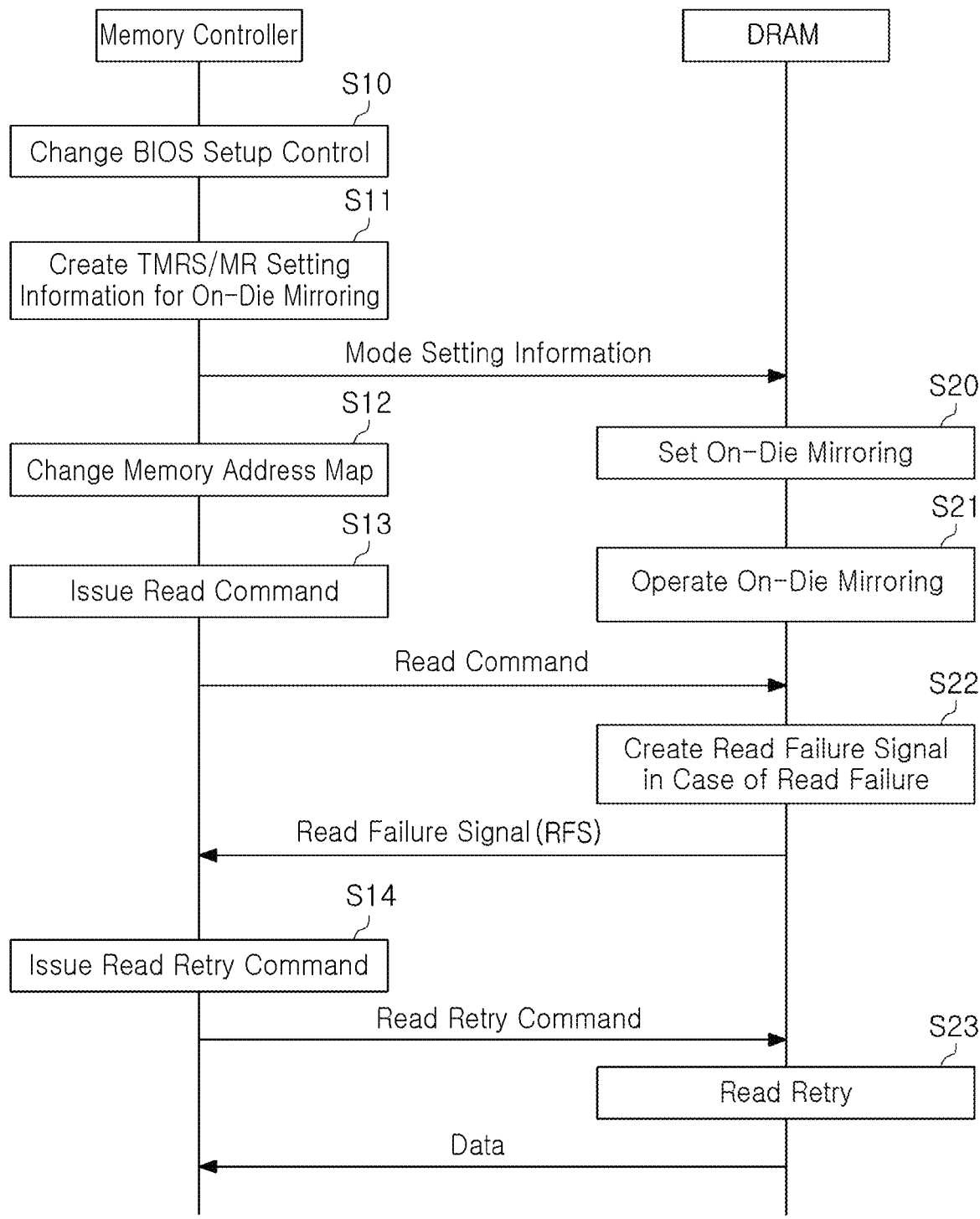
FIG. 15 is a ladder diagram illustrating an on-die mirroring operation of a memory system according to an example embodiment of the present inventive concepts.

FIG. 15 is a ladder diagram illustrating an on-die mirroring operation of a memory system according to an example embodiment of the present inventive concepts. Referring to FIG. 15, the on-die mirroring operation of the memory system 20 (see FIG. 10) may proceed as follows.

The memory controller 200 (refer to FIG. 10) may perform a BIOS setup control change, when an on-die mirroring operation is desired for a memory (S10). The memory controller 200 may generate test mode register set (TMRS)/mode register (MR) setting information for the on-die mirroring operation of the memory 100 (S11). The TMRS/MR setting information may be transmitted from the memory controller 200 to the memory 100.

The memory 100 may receive the TMRS/MR setting information, and may set an on-die mirroring mode (S20). Thereafter, the memory 100 may perform the on-die mirroring operation (S21). For example, the same data may be written in the normal area A and the mirrored area in a single write command.

The memory controller 200 may change a memory address map, when the memory 100 enters the on-die mirroring mode (S12). For example, although access to the memory 100 may be performed using a full address in the normal mode, the access to the memory 100 may be performed by ignoring a most significant bit of a row address in the on-die mirroring mode. For example, a storage capacity of the memory 100 in the on-die mirroring mode may be adjusted to half a storage capacity thereof in the normal mode.

In the on-die mirroring mode, the memory controller 200 may issue a read command (S13). The memory controller 200 may transmit the read command to the memory 100. The memory 100 may perform a read operation in response to the read command, and may generate a read failure signal (RFS) from the read failure indicator 180 (see FIG. 10), when the read operation fails. When the read failure signal (RFS) is generated, the memory 100 may transmit the read failure signal (RFS) to the memory controller 200 for read retry.

The memory controller 200 may receive the read failure signal (RFS) from the memory 100, and may issue a read retry command (S14). The memory controller 200 may transmit the read retry command to the memory 100.

The memory 100 may perform a read retry operation of outputting data of the mirrored area as read data in response to the read retry command (S23).

An on-die mirroring memory having a read failure indicator according to an example embodiment of the present inventive concepts may be activated in conjunction with a system reliability operation. For applications that demands high reliability, such as data centers or vehicles, vendors relating to the applications may initially set up a BIOS to perform on-die mirroring operations that use half of memories, from an initial stage.

FIG. 16 is a diagram illustrating a BIOS setup according to an example embodiment of the present inventive concepts. Referring to FIG. 16, among advanced BIOS feature items, a setting item for loading into a high reliability memory may be added.

A memory system according to an example embodiment of the present inventive concepts may set a mode register (TMRS/MR) in real time, when an on-die mirroring operation is desired during a normal operation.

Figure 17:
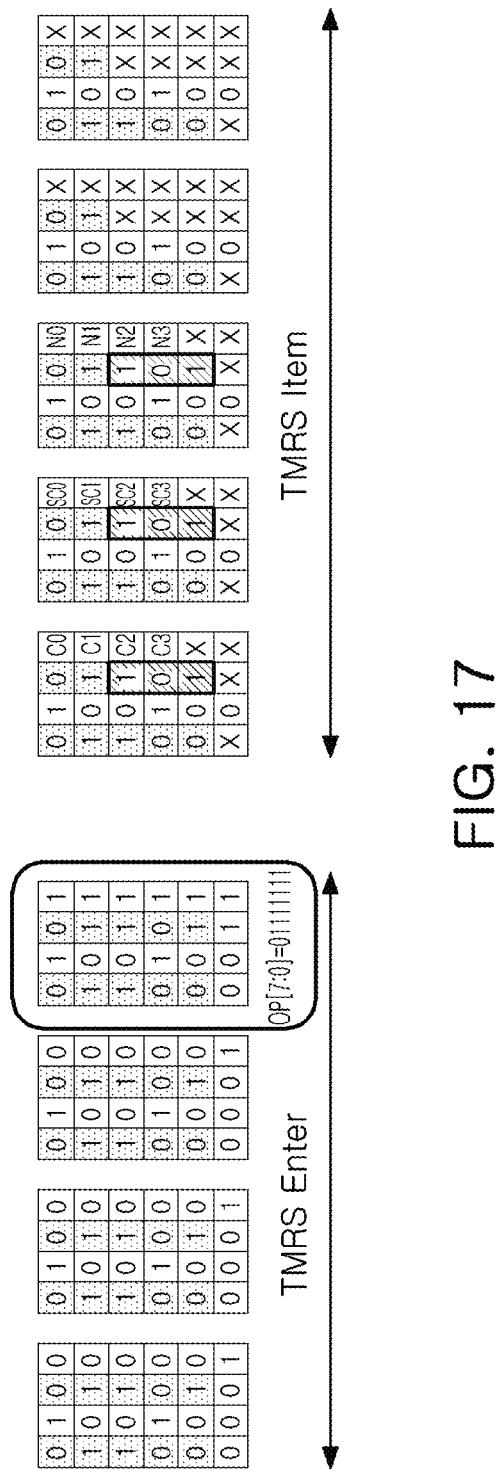
FIG. 17 is a diagram illustrating a TMRS setup according to an example embodiment of the present inventive concepts.

FIG. 17 is a diagram illustrating a TMRS setup according to an example embodiment of the present inventive concepts. Referring to FIG. 17, when an on-die mirroring operation is desired, the on-die mirroring operation may be activated by setting TMRS in an on-the-fly manner while performing a boot up or system operation. In an example embodiment, an on-die mirroring-related TMRS value determined according to a DRAM vendor may be applied, and the memory may perform half-memory and on-die mirroring operations.

Figure 18:
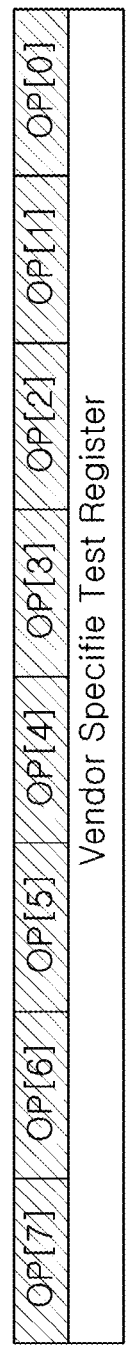
FIG. 18 is a diagram illustrating an MR setup according to an example embodiment of the present inventive concepts.

FIG. 18 is a diagram illustrating an MR setup according to an example embodiment of the present inventive concepts. Referring to FIG. 18, an on-die mirroring operation may be activated by setting an MR of a reserved area. As illustrated in FIG. 18, when the value of OP[0] of MR9 (MR[7:0]=$09_H$) is set to '1', a memory may perform an on-die mirroring operation in an on-the-fly manner. For example, the on-die mirroring setting bit may be added to a reserved area of a vendor specific test resister. In an example embodiment, such an MR may be mentioned in the JEDEC standard, and may be used generally by all memory vendors and system vendors.

As described above, upon entering the on-die mirroring mode according to the BIOS setting or TMRS/MR setting for the memory, memory mapping of the system may remap the half of the size of the memory. For example, the most significant bit of the row address may be ignored (Don't Care).

In a case of data centers or vehicles in which reliability may be important in system applications, the on-die mirroring operation may be performed at the beginning. In this case, memory capacity may be modified to a half. Further, applications such as mobiles, consumers, clients, etc., the system may monitor the memory failure pre-prediction, such as the memory usage period or the number of ECC operations, and may enable an on-die mirroring operation at some point of memory degradation. For example, the system may not use half of the DRAM capacity as a default at the beginning, may monitor application and memory status (e.g., duration, or frequency of failures), and may activate the on-die mirroring operation if desired to ensure system stability.

The present inventive concepts may also be applied to an electronic device using an application processor (AP).

Figure 19:
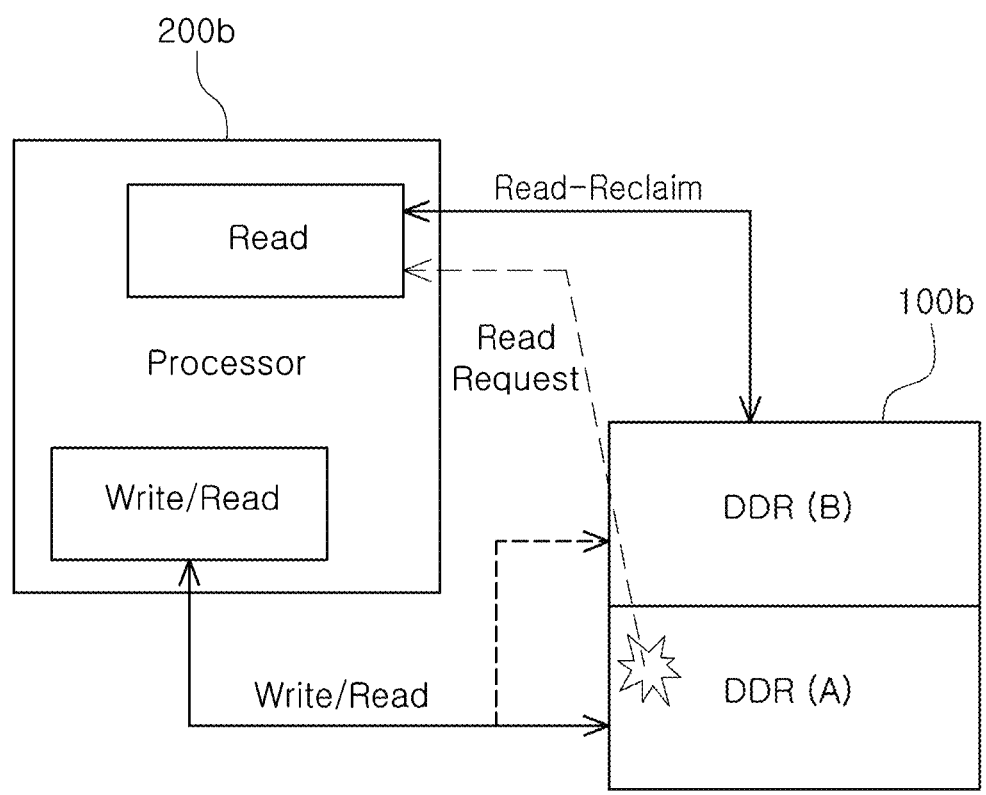
FIG. 19 is a diagram illustrating an electronic device 40 according to an example embodiment of the present inventive concepts.

FIG. 19 is a diagram illustrating an electronic device 40 according to an example embodiment of the present inventive concepts. Referring to FIG. 19, the electronic device 40 may include a memory device DDR 100*b* and a processor 200*b*. In an example embodiment, the electronic device 40 may be a single product, such as a mobile device, a consumer device, an autonomous device, or the like.

The memory device 100b may be implemented to perform an on-die mirroring operation. The memory device 100b may writing data to a first area A and a second area B at the same time in response to a write command. The memory device 100b may transmit a read request to the processor 200b, when a read fails as a result of a read operation on the first area A in response to a read command.

The processor 200b may request read-reclaim from the memory device 100b in response to the read request of the memory device 100b. The memory device 100b may perform the read-reclaim operation on the read command. The read-reclaim operation may include an operation of outputting data of the second area B of the memory device 100b to the processor 200b.

Figure 20:
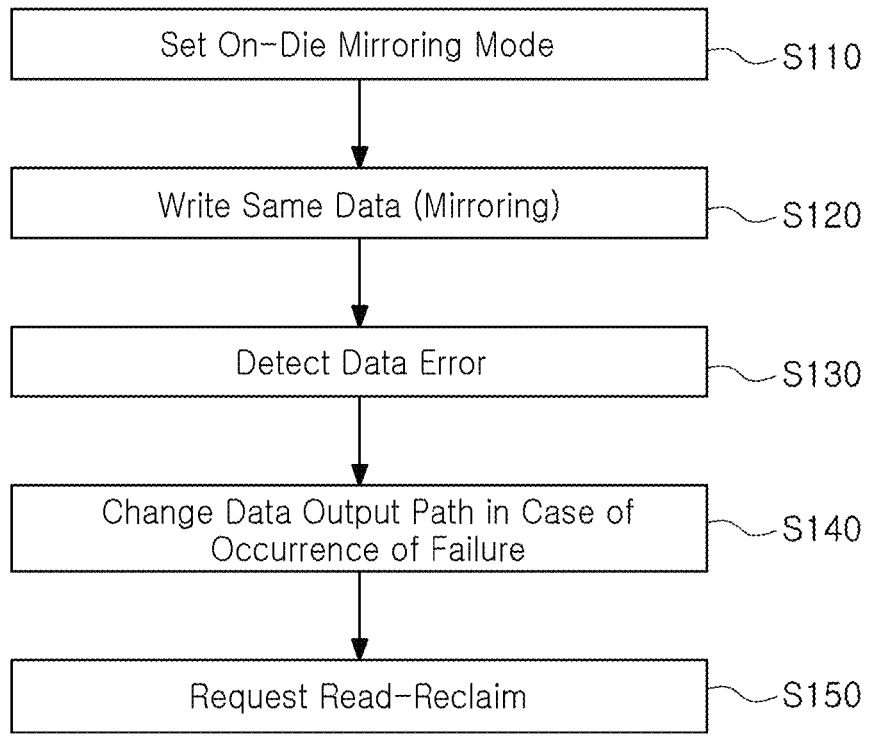
FIG. 20 is a flowchart illustrating an operating method of a memory according to an example embodiment of the present inventive concepts.

FIG. 20 is a flowchart illustrating an operating method of a memory according to an example embodiment of the present inventive concepts. Referring to FIG. 20, the memory 100 (see FIG. 10) may operate as follows.

The memory 100 may be set to an on-die mirroring mode (S110). The memory 100 may enter the on-die mirroring mode by BIOS setting and TMRS/MR setting.

The memory 100 may write the same data to the first area A and the second area B in response to an external write command (S120). The first area A may store writing data, and the second area B may store mirroring data corresponding to the writing data.

Thereafter, the memory 100 may perform a read operation in response to a read command. As a result of the read operation, error detection of data in the first area A may be performed (S130). When the detected error is not correctable, a defect for the memory cell of the first area A corresponding to the read command may be determined, the memory 100 may change a data output path (S140), and the memory controller 200 (see FIG. 10) may request a read-reclaim (S150).

Figure 21:
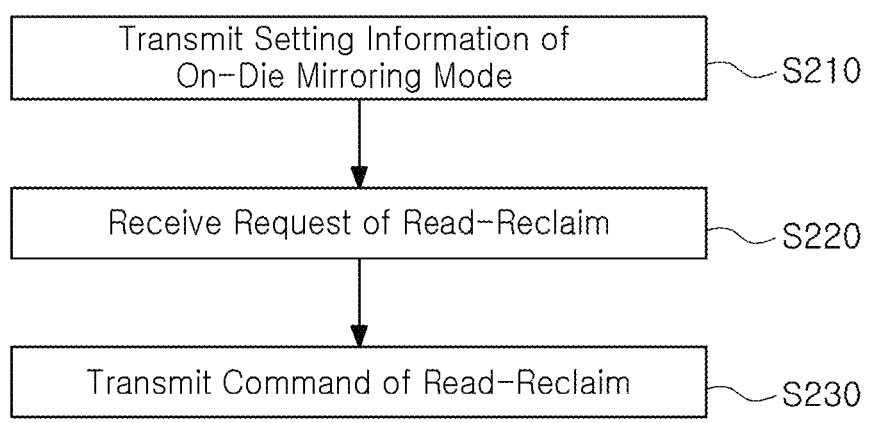
FIG. 21 is a flowchart illustrating an operating method of a memory controller according to an example embodiment of the present inventive concepts.

FIG. 21 is a flowchart illustrating an operating method of a memory controller according to an example embodiment of the present inventive concepts. Referring to FIG. 21, the memory controller 200 (see FIG. 10) may perform a read-reclaim operation as follows.

The memory controller 200 may transmit on-die mirroring mode setting information to a memory 100 requiring high reliability (S210). During an on-die mirroring operation of the memory 100, the memory controller 200 may receive a read-reclaim request from the memory 100 (S220). The memory controller 200 may transmit a read command for read-reclaim to the memory 100 in response to the read-claim request (S230). The memory 100 may output mirroring data in response to the read command.

Figure 22:
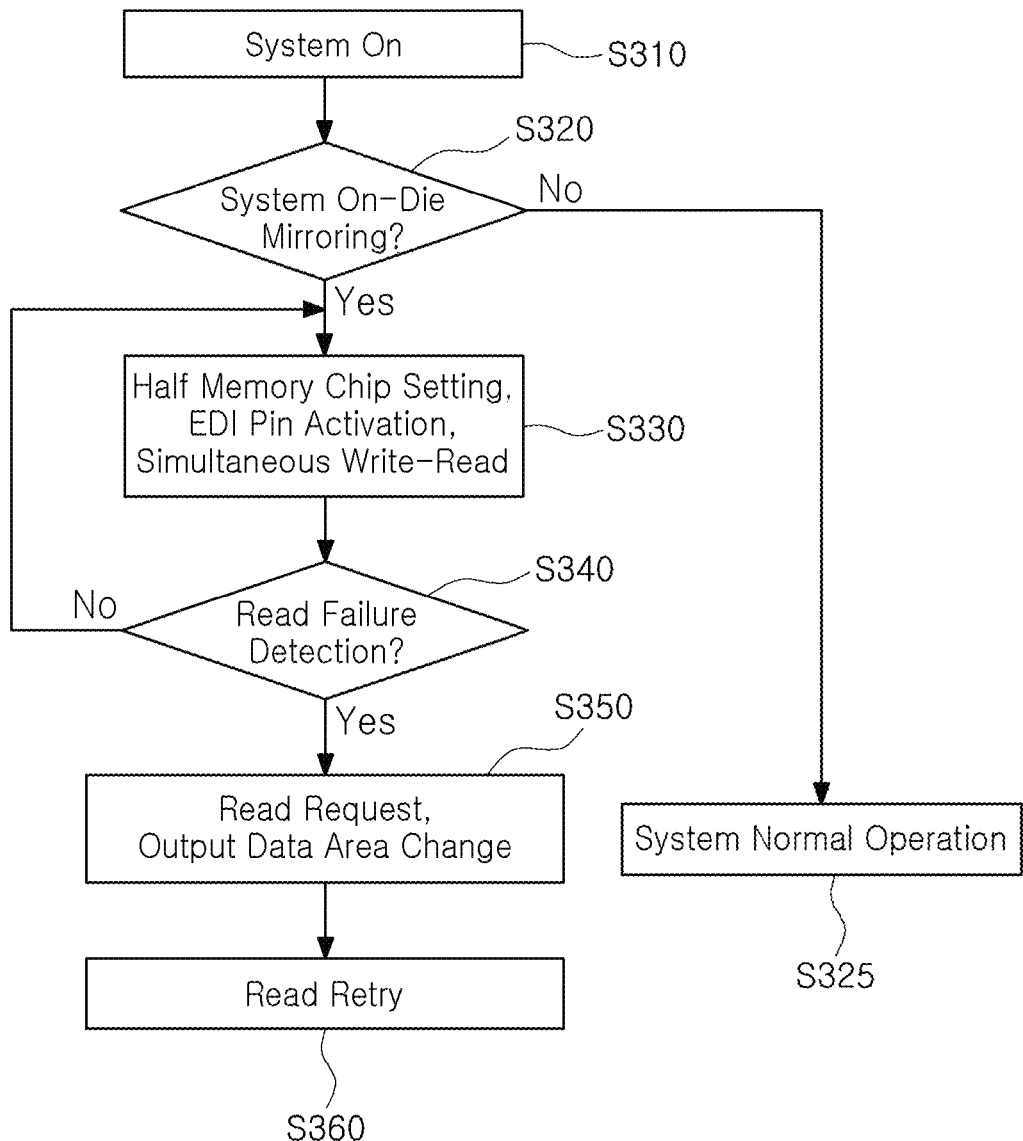
FIG. 22 is a flowchart illustrating an operating method of a memory system according to an example embodiment of the present inventive concepts.

FIG. 22 is a flowchart illustrating an operating method of a memory system according to an example embodiment of the present inventive concepts. Referring to FIG. 22, a memory system 20 may perform a read retry operation as follows.

The memory system 20 may be system-on according to power applied (S310). The memory system 20 may determine whether an operation mode is a system on-die mirroring mode (S320). When the operation mode is not the system on-die mirroring mode, the memory system 20 may operate in a normal mode (S325). When the operation mode is the system on-die mirroring mode, the memory system 20 may set a memory 100 connected to a memory controller 200, as a half of the memory for an on-die mirroring operation. In this case, an error detect indicator (EDI) pin may be activated in the memory 100, and a simultaneous write-read operation may be performed (S330).

In a read operation of the memory 100, it may be determined whether a read failure is detected (S340). When the read failure is not detected, S330 may proceed. When the read failure is detected, the memory 100 may transmit a read retry request to the memory controller 200, and may change an output data area from a normal area to a mirrored area (S350). Thereafter, the memory controller 200 may transmit a read command to the memory 100 in response to the read retry request, and the memory 100 may perform a read retry operation outputting data of the mirrored area in response to the read command re-transmitted (S360).

A memory of the present inventive concepts may be implemented in a stack type.

Figure 23:
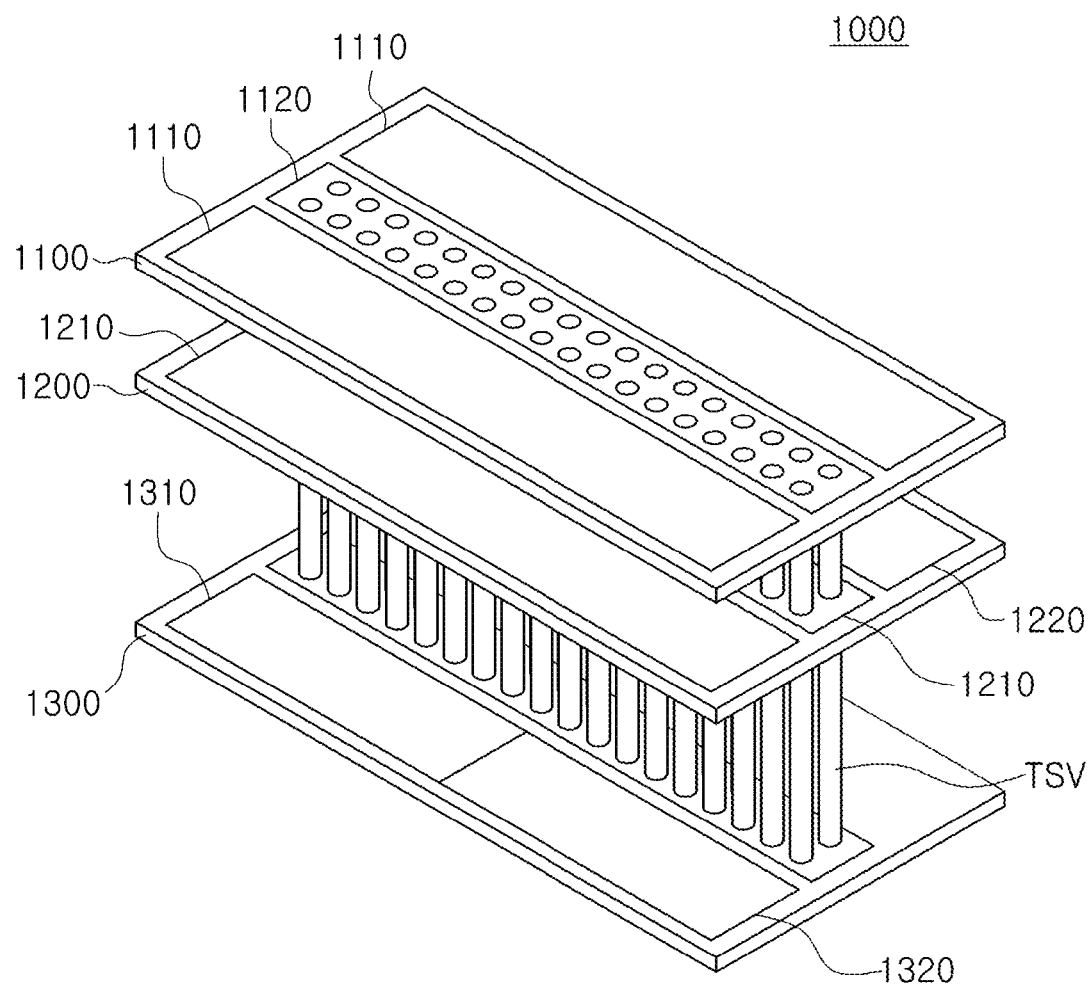
FIG. 23 is a block diagram illustrating a memory according to an example embodiment of the present inventive concepts.

FIG. 23 is a block diagram illustrating a memory according to an example embodiment of the present inventive concepts. Referring to FIG. 23, a memory 1000 may include first to third memory dies 1100 to 1300 and through silicon vias (TSVs) stacked in a vertical direction on a substrate. In this case, the number of stacked memory dies will not be limited to that illustrated in FIG. 23. For example, first and second memory dies 1100 and 1200 may be slave dies, and a third memory die 1300 may be a master die or a buffer die.

The first memory die 1100 may include a first memory cell array 1110, and a first through electrode area 1120 for access to the first memory cell array 1110. The second memory die 1200 may include a second memory cell array 1210, and a second through electrode area 1220 for access to the second memory cell array 1210. In this case, the first through electrode area 1120 may represent an area in which through electrodes for communication between the first memory die 1100 and the third memory die 1300 are disposed in the first memory die 1100. Similarly, the second through electrode area 1220 may represent an area in which through electrodes for communication between the second memory die 1200 and the third memory die 1300 are disposed in the second memory die 1200. The through electrodes may provide electrical paths between the first through third memory dies 1100 to 1300. The first to third memory dies 1100 to 1300 may be electrically connected to each other by the through electrodes. For example, the number of through electrodes may be hundreds to thousands, and the through electrodes may be arranged in a matrix arrangement. The third memory die 1300 may include a first peripheral circuit 1310 and a second peripheral circuit 1320. In this case, the first peripheral circuit 1310 may include circuits for access to the first memory die 1100, and the second peripheral circuit 1320 may include circuits for access to the second memory die 1200.

A memory module of the present inventive concepts may be applicable to a computing system further including a nonvolatile dual in-line memory module (NVDIMM).

Figure 24:
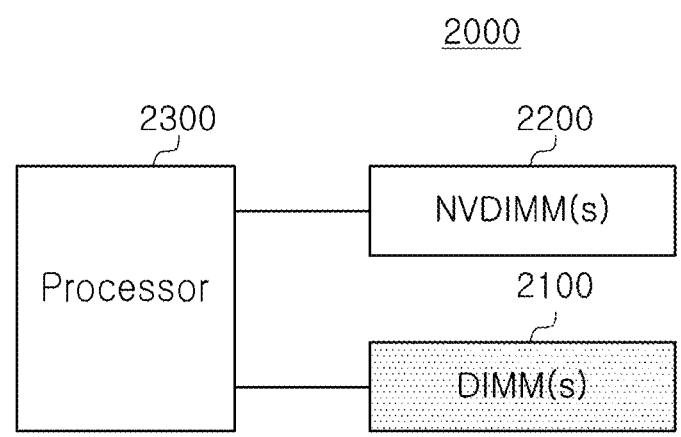
FIG. 24 is a diagram illustrating a computing system 2000 according to an example embodiment of the present inventive concepts.

FIG. 24 is a diagram illustrating a computing system 2000 according to an example embodiment of the present inventive concepts. Referring to FIG. 24, the computing system 2000 may include at least one memory module (DIMM) 2100, at least one nonvolatile memory module (NVDIMM) 2200, and at least one processor 2300.

The computing system 2000 may be used as a computer, a portable computer, an ultra mobile PC (UMPC), a workstation, a data server, a netbook, a personal digital assistant (PDA), a tablet, a wireless phone, a mobile phone, a smartphone, an e-book, a portable multimedia player (PMP), a digital camera, a digital audio recorder/player, a digital camera/video recorder/player, a portable game machine, a navigation system, a black box, a 3D television, device receiving and transmitting information from and to wireless environments, any one of various electronic devices constituting a home network, any one of various electronic devices constituting a computer network, any one of various electronic devices constituting a telematics network, an RFID, or any one of various electronic devices constituting a computing system.

The at least one memory module 2100 may be implemented to perform the on-die mirroring operation described with reference to FIGS. 1 to 23. In an example embodiment, the memory module 2100 may be connected to the processor 2300 along a DDRx interface.

The at least one nonvolatile memory module 2200 may include at least one nonvolatile memory. In an example embodiment, the at least one nonvolatile memory may include a NAND flash memory, a vertical NAND (VNAND), a NOR flash memory, a resistive random access memory (RRAM), a phase-change memory (PRAM), a magneto-resistive random access memory (MRAM), a ferroelectric random access memory (FRAM), a spin injection torque random access memory (STT-RAM), a thyristor random access memory (TRAM), or the like. In an example embodiment, the nonvolatile memory module 2200 may be connected to the processor 2300 along a DDR interface.

At least one processor 2300 may be implemented to control the memory module 2100 and the nonvolatile memory module 2200. In an example embodiment, the processor 2300 may include a general purpose microprocessor, a multicore processor, a digital signal processor (DSP), an application specific integrated circuit (ASIC), or a combination thereof.

A computing system 2000 according to an example embodiment of the present inventive concepts may significantly improve data reliability by performing an on-die mirroring operation according to the reliability request.

Meanwhile, the present inventive concepts may be applied to a mobile device.

Figure 25:
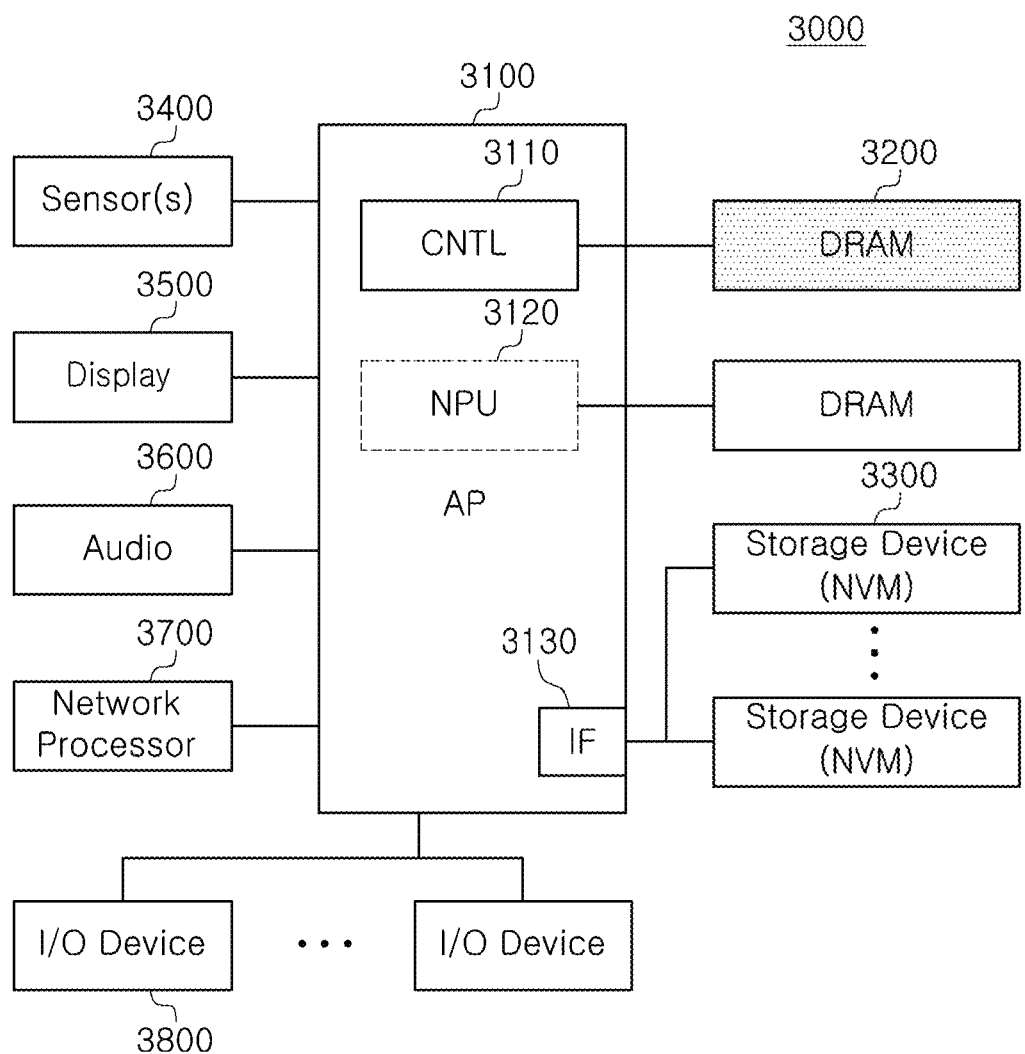
FIG. 25 is a diagram illustrating a mobile device 3000 according to an example embodiment of the present inventive concepts.

FIG. 25 is a diagram illustrating a mobile device 3000 according to an example embodiment. Referring to FIG. 25, the mobile device 3000 may include an application processor 3100, at least one DRAM 3200, at least one storage device 3300, at least one sensor 3400, a display device 3500, an audio device 3600, a network processor 3700, and at least one input/output device 3800. For example, the mobile device 3000 may be implemented as a laptop computer, a mobile phone, a smartphone, a tablet personal computer, or a wearable computer.

The application processor 3100 may be implemented to control an overall operation of the mobile device 3000. The application processor 3100 may execute applications that provide an internet browser, a game, a video, and the like. In an example embodiment, the application processor 3100 may include a single core or a multi-core. For example, the application processor 3100 may include a multi-core such as a dual-core, a quad-core, a hexa-core, or the like. In an example embodiment, the application processor 3100 may further include a cache memory located internally or externally.

The application processor 3100 may include a controller 3110, a neural processing unit (NPU) 3120, and an interface 3130. In an example embodiment, the NPU 3120 may optionally be provided.

In an example embodiment, the application processor 3100 may be implemented as a system-on-chip (SoC). A kernel of an operating system running in the system-on-chip (SoC) may include an input/output (I/O) scheduler, and a device driver controlling the storage device 3300. The device driver may control access performance of the storage device 3300 with reference to the number of sync queues managed by the input/output scheduler, or may control a CPU mode, a DVFS level, or the like in the SoC (System-on-Chip).

The DRAM 3200 may be connected to the controller 3110. The DRAM 3200 may store data desired for an operation of the application processor 3100. For example, the DRAM 3200 may temporarily store an operating system (OS) and application data, or may be used as an execution space of various software codes.

The DRAM 3200 may perform an on-die mirroring operation described with reference to FIGS. 3 to 11 or may be implemented as an on-die mirroring memory. A DRAM 3200 may be connected to the NPU 3120. The DRAM 3200 may store data related to artificial intelligence (AI) calculation.

DRAM 3200 may have relatively faster latency and bandwidth (BW) than the I/O device or the flash memory. The DRAM 3200 may be initialized at mobile power-on, may be used as a temporary storage location of OS and application data by loading the OS and application data, or may be used as an execution space of various software codes. The mobile system performs a multitasking operation of simultaneously loading several applications, and switching between applications and execution speed may be used as a performance index of the mobile system. The storage device 3300 may be connected to the interface 3130. In an example embodiment, the interface 3130 may be operated by any one communication protocol among DDR, DDR2, DDR3, DDR4, a low power DDR (LPDDR), a universal serial bus (USB), a multimedia card (MMC), an embedded MMC, a peripheral component interconnection (PCI), a nonvolatile memory express (NVMe), a peripheral component interconnect express (PCIe), a serial at attachment (SATA), a small computer system interface (SCSI), a serial attached SCSI (SAS), an universal storage bus (USB) attached SCSI (UAS), an internet small computer system interface (iSCSI), a fiber channel, and a fiber channel over ethernet (FCoE). In an example embodiment, any one storage device 3300 may be included in the mobile device 3000 in an embedded form. In another example embodiment, any one storage device 3300 may be included in the mobile device 3000 in a detachable manner.

The storage device 3300 may be implemented to store user data. For example, the storage device 3300 may store data collected from the sensor 3400, or may store data network data, augmented reality (AR)/virtual reality (VR) data, or high definition (HD) 4K contents. The storage device 3300 may include at least one nonvolatile memory device. For example, the storage device 3300 may include a solid state driver (SSD), an embedded multimedia card (eMMC), or the like.

In an example embodiment, the storage device 3300 may be implemented as a separate memory in the application processor 3100, or may be implemented as a single package with the application processor 3100.

In an example embodiment, the storage device 3300 may be mounted using various types of packages. For example, the storage device 3300 may be mounted using packages (e.g., Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP)).

The sensor 3400 may be implemented to sense an external environment of the mobile device 3000. In an example embodiment, the sensor 3400 may include an image sensor that senses an image. In this case, the sensor 3400 may transmit generated image information to the application processor 3100. In another example embodiment, the sensor 3400 may include a biosensor sensing biometric information. For example, the sensor 3400 may sense a fingerprint, an iris pattern, a blood vessel pattern, a heart rate, a blood sugar level, and the like, and may generate sensing data corresponding to the sensed information. On the other hand, the sensor 3400 is not limited to the image sensor and the biosensor. For example, the sensor 3400 may include any sensor (e.g., an illuminance sensor, an acoustic sensor, or an acceleration sensor).

The display device 3500 may be implemented to output data. For example, the display device 3500 may output image data sensed using the sensor 3400 or output data calculated using the application processor 3100.

The audio device 3600 may be implemented to externally output voice data or sense external voices.

The network processor 3700 may be implemented to communicate with an external device by a wired or wireless communication method.

The input/output device 3800 may be implemented to input data to or output data from the mobile device 3000. The input/output device 3800 may include devices that provide digital input and output functions such as a USB, a storage, a digital camera, a SD card, a touch screen, a DVD, a modem, or a network adapter.

Example embodiments of the present inventive concepts may be applied to various kinds of computing systems, for example, CPU/GPU/NPU platforms.

Figure 26:
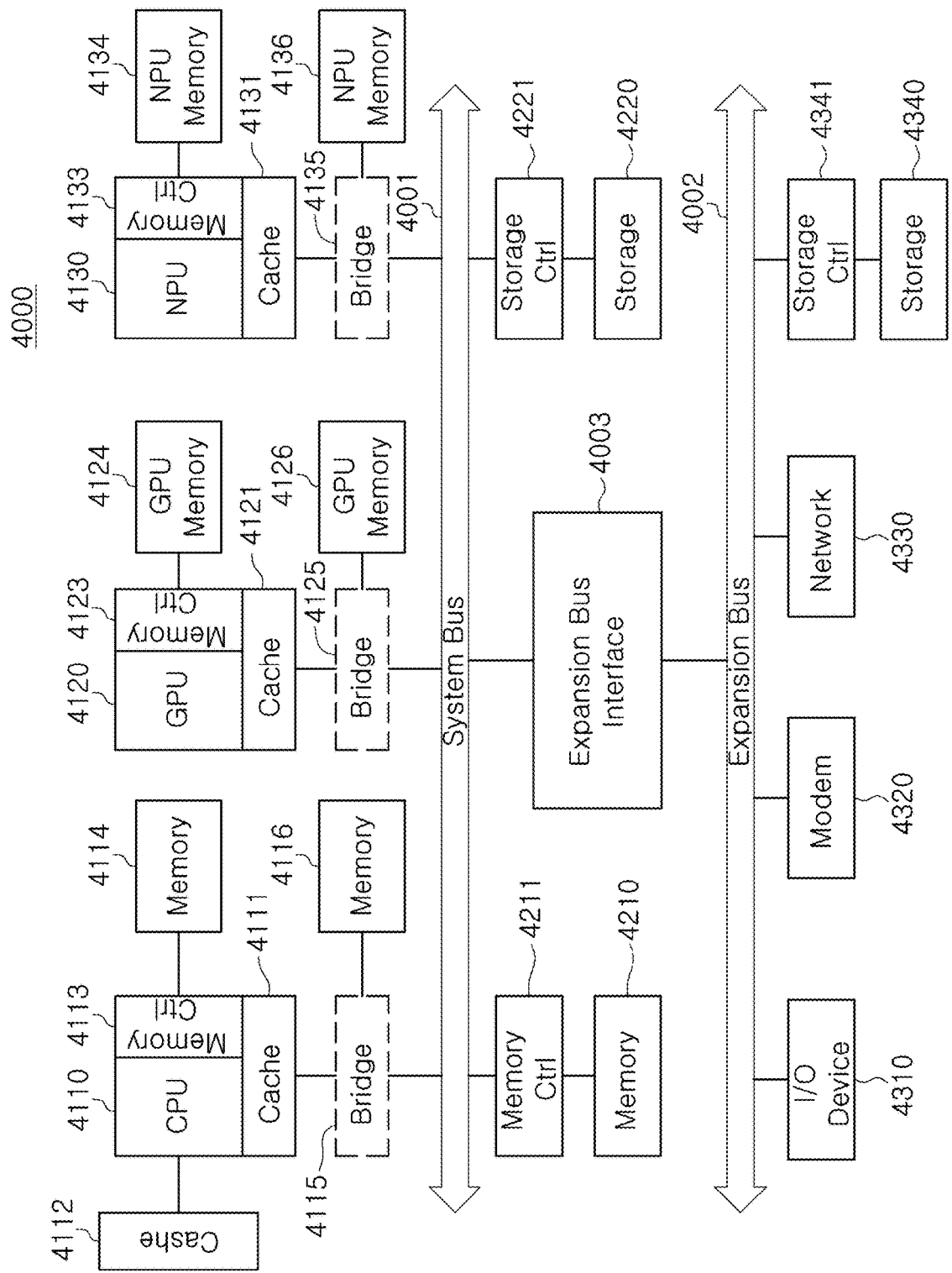
FIG. 26 is a diagram illustrating a computing system 4000 according to an example embodiment of the present inventive concepts.

FIG. 26 is a diagram illustrating a computing system 4000 according to an example embodiment of the present inventive concepts. Referring to FIG. 26, the computing system 4000 may include a Central Processing Unit (CPU) 4110, a Graphics Processing Unit (GPU) 4120, or a Neural Processing Unit (NPU) 4130 (or an application-specific processing unit), connected to a system bus 4001, a memory device 4210 or a storage device 4220 connected to the system bus 4001, and an input/output device 4310, a modem 4320, a network device 4330, or a storage device 4340, connected to an expansion bus 4002. In this case, the expansion bus 4002 may be connected to the system bus 4001 through an expansion bus interface 4003.

In an example embodiment, the CPU 4110, the GPU 4120, and the NPU 4130 may include on-chip caches 4111, 4121, and 4131, respectively.

In an example embodiment, the CPU 4110 may include an off-chip cache 4112. Although not illustrated in FIG. 26, each of the GPU 4120 and the NPU 4130 may also include an off-chip cache. In an example embodiment, the off chip cache 4112 may be internally connected to the CPU 4110, the GPU 4120, and the NPU 4130 through different buses.

In an example embodiment, the on-chip/off-chip cache may include a volatile memory (e.g., a dynamic random access memory (DRAM), or a static random access memory (SRAM)), or a nonvolatile memory (e.g., a NAND flash memory, a phase random access memory (PRAM), or a resistive random access (RRAM)).

In an example embodiment, main memories 4114, 4124, and 4134 may be connected to the CPU 4110, the GPU 4120, and the NPU 4130 through corresponding memory controllers 4113, 4123, and 4133. In an example embodiment, memories 4116, 4126, and 4136 may be connected to the CPU 4110, the GPU 4120, and the NPU 4130 through bridges 4115, 4125, and 4135. The bridges 4115, 4125, and 4135 may include memory controllers (not shown) that control the corresponding memories 4116, 4126, and 4136. In an example embodiment, the bridges 4115, 4125, and 4135 may be respectively implemented as a network device, a wireless network device, a switch, a bus, a cloud, or an optical channel.

In an example embodiment, the memories 4124 and 4126 may include a GPU memory. The GPU memory may hold instructions and data that may interact with the GPU. Commands and data may be copied from a main memory or a storage. The GPU memory may store image data, and may have greater bandwidth than a memory. The GPU memory may separate a clock from the CPU. The GPU may read and process image data in GPU memory, and may then write in the GPU memory. The GPU memory may be configured to accelerate graphics processing.

In an example embodiment, the memories 4134 and 4136 may include an NPU memory. The NPU memory may hold instructions and data that may interact with the NPU. Commands and data may be copied from a main memory or a storage. The NPU memory may maintain weight data for neural networks. The NPU memory may have greater bandwidth than a memory. The NPU memory may separate a clock from the CPU. The NPU may read and update weighted data in the NPU memory, and then write in the NPU memory during training. The NPU memory may be configured to accelerate machine learning, for example, neural network training and inference.

In some example embodiments, each of the main memories 4114, 4116, 4124, 4126, 4134, 4136, and 4210 may be implemented as a memory performing the on-die mirroring operation described with reference to FIGS. 3 to 23.

In an example embodiment, the main memory may include a volatile memory (e.g., a DRAM, or an SRAM), or a nonvolatile memory (e.g., a NAND flash memory, a PRAM, or a RRAM). The main memory has lower latency and lower capacity than those of secondary storages 4210 and 4220.

The CPU 4110, the GPU 4120, or the NPU 4130 may access the secondary storages 4210 and 4220 through the system bus 4001. The memory device 4210 may be controlled by a memory controller 4211. In this case, the memory controller 4211 may be connected to the system bus 4001. The storage device 4220 may be controlled by a storage controller 4221. The storage controller 4221 may be connected to the system bus 4001.

The storage device 4220 may be implemented to store data. The storage controller 4221 may be implemented to read data from the storage device 4220 and transmit the read data to a host. The storage controller 4221 may be implemented to store the transmitted data in the storage device 4220 in response to a request from the host. Each of the storage device 4220 and the storage controller 4221 may include a buffer that stores metadata, reads a cache for storing frequently-accessed data, or stores a cache for increasing a writing efficiency. For example, a write cache may receive and process a specific number of write requests.

The storage device 4220 may include a volatile memory such as a hard disk drive (HDD), and a nonvolatile memory such as an NVRAM, an SSD, an SCM, or a new memory.

The storage device 4340 may be implemented to store data. A storage controller 4341 may be implemented to read data from the storage device 4340 and transmit the read data through the expansion bus 4002

An example embodiment of the present inventive concepts may be applied to a data server system.

Figure 27:
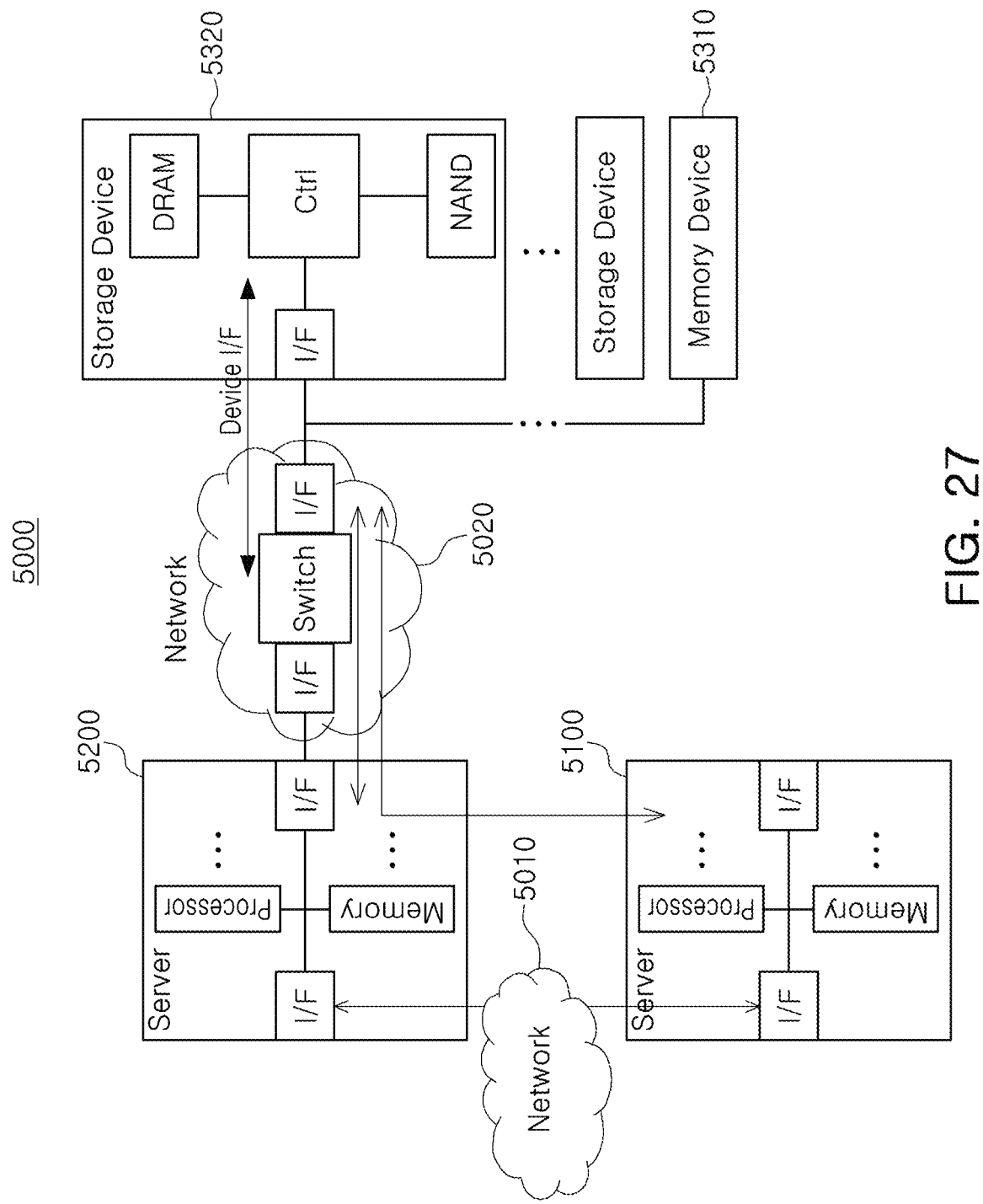
FIG. 27 is a diagram illustrating a data server system 5000 according to an example embodiment of the present inventive concepts.

FIG. 27 is a diagram illustrating a data server system 5000 according to an example embodiment of the present inventive concepts. Referring to FIG. 27, the data server system 5000 may include a first server 5100 (an application server), a second server 5200 (a storage server), a memory device 5310, and at least one storage device 5320.

Each of the first server 5100 and the second server 5200 may include at least one processor and memory. In an example embodiment, each of the first server 5100 and the second server 5200 may be implemented as a memory-processor pair. In another example embodiment, each of the first server 5100 and the second server 5200 may be implemented with a different number of processors and memories suitably for use. Each of the first server 5100 and the second server 5200 may include one or more interfaces for communication with another server or a storage device through network.

In an example embodiment, the first server 5100 and the second server 5200 may perform communications through a first network 5010. In an example embodiment, each of the first server 5100 and the second server 5200 may access the memory device 5310 through the first network 5010 and/or a second network 5020. In an example embodiment, each of the first server 5100 and the second server 5200 may directly or indirectly access the storage device 5320 through the first network 5010 and the second network 5020.

In an example embodiment, an interface I/F of the storage device 5320 may include SATA, SAS, PCIe, DIMM, HBM, HMC, or NVDIMM. In an example embodiment, the second network 5020 may be a connection type of a direct attached storage (DAS), a network attached storage (NAS), and a storage area network (SAN) scheme.

In an example embodiment, the memory device 5310 and the storage device 5320 may respectively transmit device information to the second server 5200 by a command or by itself. In an example embodiment, the memory device 5310 may perform the on-die mirroring operation described with reference to FIGS. 3 to 23 or may include an on-die mirroring memory.

The data server system 5000 may perform big data AI calculation. In this case, the big data may include audio, photo, video, or weight/training data.

An on-die mirroring device according to an example embodiment of the present inventive concepts may include a memory failure determining device, and an output area changing device to a mirrored area when a failure occurs.

A memory system according to an embodiment of the present inventive concepts may be implemented with a failure indicator device, a system delivery method, and a flow of receiving a failure occurrence signal and performing a read retry systemically, by reading a mirrored area, not a current failure area, when the failure occurs during the system operation. Therefore, normal data may be read to expect the improvement in reliability for system. Accordingly, the memory system of the present inventive concepts may improve prevention of decrease in performance, inefficiency management of memory usage, etc. in applications occurring in a channel mirroring operation applied to RAS (Reliability, Availability, and Serviceability), or the like.

An on-die mirroring DRAM according to an embodiment of the present inventive concepts may be applied to automotive and mobile/consumer applications using a package (PKG), a multi-chip PKG (MCP), or the like, a data center (DC) using a variety of DRAM modules, a personal computer (PC), or the like. Further, an on-die mirroring DRAM according to an example embodiment of the present inventive concepts may be applied to all PKG/module types including graphic applications utilizing a system-in-PKG (SiP) assembled with an expensive high bandwidth memory (HBM), and all application systems utilizing such memory.

An on-die mirroring DRAM according to an example embodiment of the present inventive concepts may be divided into two low and high areas of the last row address in the same bank. The system may operate by "don't care" at the highest row address during the on-die mirroring operation.

The on-die mirroring DRAM may simultaneously write the low and high areas of the highest row address in the bank. In determining a defect, failure of written data may be referred to as Fail when data of the mirrored area and data as an EXOR are present, and in a case of an on-die ECC memory, as "Correctable Error (CE)" and "Uncorrectable Error (UE)" by the memory itself. When a defect in the memory is confirmed, the on-die mirroring DRAM may change a current data output path to the mirrored area, and, at the same time, may generate a read request to a system host.

In an example embodiment, H/W as a read request means when a failure occurs may add an additional pin (an error indicator signal (EIS)) or may use a pin performing "Don't Care" when applying a mirrored mode. In a case of occurring a failure, whether the failure or not may be transmitted by phase of the pin. For example, when the pin is on a high level, it will be referred to as "Fail", and, when the pin is on a low level, it will be referred to as "Pass". A logic to change a data area may be included.

In an example embodiment, H/W as a read request means when a failure occurs may make a dummy read CLK in the DQS to transmit whether the current read data is "Pass/Fail". In an example embodiment, S/W as a read request means when a failure occurs may use a mode register (MR).

An on-die mirroring operation according to an example embodiment of the present inventive concepts may be applied to a PKG, a multi-chip-package (MCP) and a system-in-PKG (SiP), and may be included in all of single-unit mounting and module, or the like. A system according to an example embodiment of the present inventive concepts may apply a test mode register set (TMRS) or may set a mode register (MR) Issue by using a BIOS to apply the on-die mirroring operation.

A memory, a memory system having the same, and an operating method thereof according to an example embodiment of the present inventive concepts may improve reliability of data by performing an on-die mirroring operation.

Any decoder, controller, or processor recited in this disclosure may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be apparent to those skilled in the art that modifications and variations could be made without departing from the scope of the present inventive concepts as defined by the appended claims.

What is claimed is:

1. A memory system comprising:
a first central processing unit;
a first memory module including a plurality of first memories and connected to the first central processing unit by a first channel;
a second memory module including a plurality of second memories and connected to the first central processing unit by a second channel; and
a third memory module including a plurality of third memories and connected to the first central processing unit by a third channel,
wherein each of the first, second, and third memories includes a data area and a mirroring data area, and is configured to write same data in the data area thereof and the mirroring data area thereof in response to an address, in a mirroring mode, and
the mirroring data area has a storage capacity comparable to the data area.

2. The memory system according to claim 1, wherein each of the plurality of the first, second, and third memories comprises processing circuitry, the processing circuitry configured to perform a read operation of data of the data area in response to a read command from the first central processing unit, determine whether the read operation of the data of the data area fails, and generate a read failure signal as a result of the determining.

3. The memory system according to claim 2, wherein the processing circuitry is configured to generate the read failure signal when the data of the data area and data of the mirroring data area in response to the read command are different from each other.

4. The memory system according to claim 2, wherein the processing circuitry is configured to perform an error correction operation on the data of the data area in response to the read command, and generate the read failure signal according to a result of the error correction operation.

5. The memory system according to claim 2, wherein the first central processing unit is configured to transmit a read retry command corresponding to the read failure signal to a corresponding one of the first memory module, the second memory module, or the third memory module.

6. The memory system according to claim 5, wherein each of the first, second, and third memories of the corresponding one of the first memory module, the second memory module, or the third memory module changes an output path of the read operation from the data area to the mirroring data area in response to the read retry command.

7. The memory system according to claim 1, wherein each of the first, second, and third memories is configured to ignore an uppermost bit of a row address at the address, in the mirroring mode.

8. The memory system according to claim 1, further comprising:
a second central processing unit in communication with the first central processing unit;
a fourth memory module connected to the second central processing unit through a fourth channel;
a fifth memory module connected to the second central processing unit through a fifth channel; and
a sixth memory module connected to the second central processing unit through a sixth channel.

9. A memory system comprising:
a plurality of memory modules connected to each of a plurality of channels, each of the memory modules including at least one memory; and
a memory controller connected to the channels and configured to control the at least one memory included in each of the memory modules,
wherein the at least one memory comprises,
a first memory area configured to store writing data during a write operation in a mirroring mode, in response to an address,
a second memory area configured to store the writing data during the write operation in the mirroring mode, in response to the address, and
processing circuitry configured to generate a read failure signal when a read operation of the first memory area fails in the mirroring mode, and
wherein the first memory area has a storage capacity comparable to the second memory area.

10. The memory system according to claim 9, wherein the processing circuitry is configured to generate the read failure signal by comparing first data output from the first memory area and second data output from the second memory area during the read operation.

11. The memory system according to claim 9, wherein the processing circuitry is configured to perform an error correction operation of correcting an error of data output from the first memory area during the read operation, and generate the read failure signal according to a result of the error correction operation.

12. The memory system according to claim 9, wherein the at least one memory further comprises an error indication signal pin and is configured to use the error indication signal pin to transmit the read failure signal to the memory controller.

13. The memory system according to claim 9, wherein the at least one memory is configured to use at least one DQS pin to transmit the read failure signal to the memory controller.

14. The memory system according to claim 9, wherein
the at least one memory further comprises a mode register configured to store the read failure signal, and
the memory controller is configured to identify a failure of the read operation by reading the mode register.

15. The memory system according to claim 9, wherein the memory controller is configured to transmit a read retry command to the at least one memory in response to the read failure signal.

16. The memory system according to claim 15, wherein the at least one memory is configured to output data read from the second memory area to the memory controller in response to the read retry command.

17. The memory system according to claim 9, wherein the at least one memory is configured to generate a read retry request in response to the read failure signal, and transmit the read retry request to the memory controller through one of a separate pin or a DQS dummy signal.

18. The memory system according to claim 9, wherein
the at least one memory is configured to generate a read retry request in response to the read failure signal, and store information related to the read retry request in a mode register, and
the memory controller is configured to receive the read retry request by reading the mode register periodically or non-periodically.

19. A memory comprising:
a plurality of memory modules connected to each of a plurality of channels, each of the memory modules including a plurality of memories, each of the memories including a memory cell array having a first memory area and a second memory area, the memory cell array having a plurality of memory cells connected to word lines and bit lines;
a row decoder configured to select any one of the word lines in response to a row address;
a sense amplifier circuit configured to sense data from memory cells connected to selected bit lines during a read operation;
a column decoder configured to select the selected bit lines among the bit lines in response to a column address;
an address buffer configured to store address information including the row address and the column address; and
processing circuitry connected to the channels and configured to,
　correct an error of the sensed data, and generate a read failure signal when an error correction has failed,
　generate a mirroring mode activation signal corresponding to a mirroring mode,
　write same writing data to the first memory area and the second memory area during a write operation in the mirroring mode, in response to a specific address information, and
　change a data output path of the read operation from a first data output path of the first memory area to a second data output path of the second memory area in response to a read retry command in the mirroring mode,
wherein the first memory area has a storage capacity comparable to the second memory area.

* * * * *